US008484809B2

(12) United States Patent
Fiedler

(10) Patent No.: US 8,484,809 B2
(45) Date of Patent: Jul. 16, 2013

(54) MECHANICAL/MAGNETIC CONNECTING STRUCTURE

(75) Inventor: Joachim Fiedler, Berlin (DE)

(73) Assignee: Fidlock GmbH, Hannover (DE)

( * ) Notice: Subject to any disclaimer, the term of this patent is extended or adjusted under 35 U.S.C. 154(b) by 535 days.

(21) Appl. No.: 12/669,353

(22) PCT Filed: Jul. 12, 2008

(86) PCT No.: PCT/DE2008/001162
§ 371 (c)(1),
(2), (4) Date: Jun. 10, 2010

(87) PCT Pub. No.: WO2009/010049
PCT Pub. Date: Jan. 22, 2009

(65) Prior Publication Data
US 2011/0131770 A1 Jun. 9, 2011

(30) Foreign Application Priority Data
Jul. 17, 2007 (DE) ......................... 10 2007 033 277

(51) Int. Cl.
*E05C 1/00* (2006.01)
*H05K 5/02* (2006.01)

(52) U.S. Cl.
USPC ............. 24/303; 220/230; 220/315; 220/326; 292/251.5; 70/158; 70/160; 361/679.58

(58) Field of Classification Search
None
See application file for complete search history.

(56) References Cited

U.S. PATENT DOCUMENTS

| | | | | |
|---|---|---|---|---|
| 3,468,576 | A * | 9/1969 | Beyer et al. | 292/251.5 |
| 3,790,197 | A * | 2/1974 | Parker | 292/251.5 |
| 4,270,781 | A | 6/1981 | Nishimura | |
| 4,799,604 | A * | 1/1989 | Okojima et al. | 220/260 |
| 5,974,637 | A | 11/1999 | Tracy et al. | |
| 6,108,196 | A * | 8/2000 | Jung | 361/679.55 |
| 6,182,336 | B1 | 2/2001 | Bauer | |
| 6,295,702 | B1 | 10/2001 | Bauer | |
| 6,655,744 | B2 | 12/2003 | Petri et al. | |
| 6,704,194 | B2 * | 3/2004 | Koo | 361/679.27 |
| 8,172,282 | B2 * | 5/2012 | Lev et al. | 292/164 |
| 2006/0170223 | A1 * | 8/2006 | Homer et al. | 292/102 |
| 2007/0138806 | A1 * | 6/2007 | Ligtenberg et al. | 292/251.5 |

FOREIGN PATENT DOCUMENTS

| | | |
|---|---|---|
| DE | 10161289 A1 | 7/2002 |
| DE | 10104833 A1 | 8/2002 |

* cited by examiner

*Primary Examiner* — Jack W. Lavinder
(74) *Attorney, Agent, or Firm* — The Webb Law Firm

(57) ABSTRACT

The invention relates to a mechanical/magnetic connecting structure, that is to say a mechanical interlock by means of magnetic-force assistance, which is particularly suitable for closures such as those which are used on bags, rucksacks and comparable objects, wherein the connecting structure has the following features: an interlock apparatus having at least one spring interlock element which moves in a direction and is arranged in one of the connecting modules, and having a blocking piece for interlocking of the connecting modules, which blocking piece is arranged in the other connecting module, and having a movable unlocking element with a force-deflecting rising sliding surface, which is likewise arranged in the other connecting module, and a magnet armature structure having at least one magnet which is arranged in one of the connecting modules, and at least one armature which is arranged in the other connecting module.

16 Claims, 18 Drawing Sheets

MECHANICAL/MAGNETIC CONNECTING STRUCTURE

CROSS-REFERENCE TO A RELATED APPLICATION

This application is a National Phase Patent Application of International Application Number PCT/DE2008/001162, filed on Jul. 12, 2008, which claims priority of German Patent Application Number 10 2007 003 277.9, filed on Jul. 17, 2007.

BACKGROUND OF THE INVENTION

Field of the Invention

This invention relates to a mechanical-magnetic connecting structure, i.e. a mechanical lock by means of magnetic-force assistance, which is particularly suitable for closures as they are used on bags, rucksacks and comparable objects, wherein this enumeration is not meant to limit the field of application of the invention.

In principle, such connecting structures can be divided into two main groups. There are mechanical connecting structures, whose opening and closing mechanism consists of a combination of mostly positively and non-positively acting components. Frequently, springs are used in order to maintain a locking condition, so that closing and opening must be effected against the spring force. Such connecting structures are known to those skilled in the art, so that reference merely is made to the prior art from the contents of sub-classes IPC A44B.

For example, from the document U.S. Pat. No. 5,974,637 buckles are known, in which a spring catch is formed such that a separating element, such as a wedge, with a beveled surface gradually spreads open the catch, until it gets out of engagement and is released. By gradually overcoming the locking engagement, closures such as this buckle have a soft opening haptics, but they have an unsatisfactory closing haptics, since they can be closed with considerable force and mostly only with two hands.

Another main group of the connecting structures are the magnetically acting connecting structures, in which the magnetic force is utilized to hold the connection together. These connecting structures also are sufficiently known to those skilled in the art especially for closures of bags and other receptacles, so that here reference also is merely made to the contents of the sub-classes of IPC E05C.

Furthermore, combinations between these two main groups are known. In these combinations, it generally is attempted to satisfy specific requirements of a connecting structure by selectively combining the different properties of a mechanical connection and a magnetic connecting structure.

For a better understanding of the advantages of the invention, some main properties of the mechanical and magnetic connecting structures should first be discussed below.

A positive mechanical lock generally has a mechanical component, which on loading the lock is subjected to a tensile, compressive or shear stress. The magnitude of the mechanical resistance of this component defines the stability of the connecting structure. Mechanical connecting structures can be manufactured at low cost, since e.g. in bag closures merely very inexpensive iron parts or plastic parts are used.

These mechanical connecting structures basically have the property that when plugging the same together a locking spring force must be overcome manually. Therefore, the handling of the connecting structures is not very comfortable in some cases, so that magnetic connecting structures are employed, since the same automatically attract each other due to the magnetic force.

The force perceived at the hand on closing and on opening subsequently is referred to as haptics. Especially in the case of closures which are actuated by hand, the haptics must be adapted to the human hand force.

In magnetic connections in which the magnetic force is directly used to prevent opening of the connection, the magnet and the associated armature must be dimensioned corresponding to the holding force. If no particular requirements are made as to locking force and haptics, these connections can be used in principle.

In certain cases, however, the closures must be overdimensioned, e.g. when safety requirements must be fulfilled. This can be required e.g. in a rucksack for mountaineers. This rucksack must not open, even if the closure is loaded with a multiple of the normal locking force, which can occur e.g. during a fall. In so far, closures with such a requirement profile are formed as mechanical closures, since high safety factors can also be realized with mechanical structures without much additional effort. In so far, these connecting structures have gained acceptance on the mass market.

Furthermore, various mechanical connecting structures are known from the prior art, in which in addition to a mechanical lock magnets are used as well. However, the magnets merely serve to hold the mechanical lock together in the closed condition. The magnetic force is used here instead of the spring force of a mechanical spring. These structures have no pleasant haptics. They can mostly be closed relatively easily, but are more difficult to open.

The document U.S. Pat. No. 6,295,702 describes a mechanically blocked magnetic closure, in which during the closing operation magnet and armature pull tight a mechanical lock, which during the opening operation must first be unlocked before the magnetic closure can be opened.

The opening haptics is unsatisfactory, since during opening magnet and armature are separated in their main direction of attraction, i.e. the direction in which they have moved towards each other on closing, and this involves a jerky haptics, since the magnetic force of attraction is maximum in the closed position and thereafter drops strongly non-linearly. In addition, the mechanical interlock here is secured in the closed position by an additional magnet-armature system, which likewise is opened opposite to the magnetic field, so that the haptics for unlocking the closure also has a jerky characteristic and thus is unsatisfactory.

From the document U.S. Pat. No. 6,182,336 there is furthermore known a mechanical interlock of a magnetic closure, which is opened by an inclined surface of an operating knob. The opening haptics, however, also is unsatisfactory here, since magnet and armature are separated during opening in their main direction of attraction, i.e. the direction in which they have moved towards each other on closing, and this involves a pronounced jerky haptics, since the force of magnetic attraction is maximum in the closed position and thereafter drops strongly non-linearly.

SUMMARY OF THE INVENTION

For the following requirements, no connecting structure is known from the prior art:

a. locking is effected mechanically, b. connecting structure is pulled tight by itself, c. connecting structure is easy to open, i.e. has a good haptics which extends uniformly, i.e. jerk-free along the entire path of operation.

Accordingly, it is an object of the invention to provide a connecting structure which meets all three requirements a to c at the same time.

This object is solved with a mechanical-magnetic connecting structure according to claim 1. This connecting structure includes two connecting modules and serves to connect two elements, to each of which one of the connecting modules can be attached.

The connecting structure, in one embodiment, has the following features:

A locking device with at least one resiliently yielding spring locking element, which is arranged in one of the connecting modules, at least one blocking piece for positively locking the connecting modules, which is arranged in the other connecting module, and a movable unlocking element with a force-deflecting rising sliding surface. The spring locking element is formed such that on closing the connecting structure it is urged against the blocking piece. The spring locking element, the blocking piece and the surface portions of the spring locking element and of the blocking piece, which get in contact with each other, are formed such that the spring locking element is laterally deflected and finally snaps into the blocking piece, when the locking element and the blocking piece relatively move towards each other. It is clear to the skilled person that the use of the term "spring" merely should describe the property "resilient". Accordingly, this also covers all embodiments in which elastic materials are used. It is furthermore clear that the "resilient" or the "elastic" property can also be assigned to the blocking piece.

The blocking piece and the locking element are formed such that the mechanical strength is sufficient in dependence on the actually occurring or possible loads.

Furthermore, the unlocking element is movable such that it urges the spring locking element from an engagement position, in which the spring locking element is in engagement with the blocking piece, into a non-engagement position, in which the spring locking element is not in engagement with the blocking piece. The force-deflecting rising sliding surface of the spring locking element is formed such that it is urged aside against the spring force during a displacement of the spring locking element. This combination of features will be described in detail below:

When the connecting structure has snapped together, a positive connection exists. To release the engagement, the movable unlocking element is shifted until the spring locking element has been urged aside by the force-deflecting rising sliding surface, until the blocking piece no longer is in engagement with the spring locking element, i.e. the spring locking element and the blocking piece are moved from the engagement position into the non-engagement position. It is clear to the skilled person that the force-deflecting rising sliding surface need not necessarily engage the end of the spring locking element, but can also engage at another, freely selectable resilient point of the spring locking element.

The connecting structure furthermore includes a magnet-armature structure, wherein in one of the connecting modules the magnet and in the other connecting module the armature is arranged. The magnetic force between armature and magnet is chosen so great that during the closing operation the connecting modules are pulled towards each other from a predetermined minimum distance, whereby the spring locking element is urged against the blocking piece, until it snaps in engagement. In other words, magnet and armature are dimensioned such that the spring force of the spring locking element is overcome. Here, it is clear to the skilled person that magnet-armature structures can not only consist of a single magnet and a single armature. Subsequently, a magnet-armature structure therefore is understood to be any combination of magnets and armatures which at least attract each other, wherein the skilled person knows that the armature is made of a ferromagnetic material or can also be a magnet. Certain magnet-armature structures not only attract each other, but can also repel each other, when two like poles are brought into an opposed position. Unless special additional conditions apply, it is irrelevant whether the magnet is moved with respect to the armature or the armature is moved with respect to the magnet. It is also clear that the relationship between magnet and armature is the same as that between two attracting magnets.

When the connecting modules are connected, a mechanical lock and also a magnetic attraction do exist. It should be emphasized, however, that the magnetic attraction only absorbs an insignificant part of the main loading force of the connection. The magnet-armature structure almost exclusively serves the automatic closing of the connection.

To create the above-mentioned pleasant, i.e. jerk-free haptics on separating the magnet from the armature, the connecting module with the magnet and the connecting module with the armature are laterally shifted with respect to each other, until the magnetic force is weakened sufficiently, in order to be able to easily separate the modules by hand. This is the case when the armature surface facing the magnet has become sufficiently small. It is clear that the displacement between the magnet and the armature can also be a rotation or a swivel movement.

The movable magnet is coupled with the unlocking element, i.e. with the magnet the unlocking element is moved as well, wherein the term "coupled" not only means that the unlocking element must be rigidly connected with the magnet. A coupling also is understood to be a connection via a spring. A coupling also exists when a tab shifts the unlocking element, but this tab does not always rest against the unlocking element, i.e. when there is a clearance. These relations will be described in detail in the description of the embodiments.

Subsequently, some properties of embodiments will be described comprehensively:

When the magnet has sufficiently been shifted from the armature, so that the force of magnetic attraction between armature and magnet is sufficiently weak, the spring locking element has gradually been urged back, i.e. it is in the position of non-engagement. In this non-engagement position, the connecting device is both mechanically unlocked and magnetically released.

In other words, for opening the closure the magnetic force gradually is weakened or completely eliminated by laterally shifting magnet and armature with little effort and the spring locking mechanism is gradually opened with little effort. Thus, it is comprehensible that this connecting structure has a particularly soft opening haptics.

It is clear than on closing of the connecting structure the above-described open position between unlocking element and spring locking mechanism as well as between armature and magnet must not exist, i.e. the blocking piece, the spring locking element and the unlocking element must face each other on closing such that snap-in can occur. On the other hand, the magnet and the armature must face each other on closing in a position in which the magnetic force between magnet and armature is strong enough to overcome the spring force of the spring locking element, so that snapping into place can be effected.

In other words, after opening or not later than shortly before closing of the connecting structure it must be ensured that the locking structure and the magnet-armature structure each are returned into their starting position, in which pulling together and snapping into place are made possible. This return of the functional elements of the locking structure and the magnet-armature structure is effected by a return arrangement. For this purpose, a force must merely act on the component to be returned. In the present invention, preferably the force of a return spring is used for this purpose, which is pretensioned on opening of the connecting structure. It is clear to the skilled person that this return spring merely must be so strong as to urge the functional elements moved on opening back into their starting position. For this purpose merely a very small force is required, so that only a weak return spring is required. This is a reason why the above-mentioned soft and pleasant haptics is maintained.

The return can, however, also be effected with magnetic means. This effect is sufficiently known to the skilled person, so that only one possibility out of many will be explained:

When an armature and a magnet adhere to each other, this magnetic adhesive connection can be released in that the armature is pushed off from the magnet. When the surfaces of magnet and armature attracting each other are of equal size, the attracting surface portion is reduced when armature and magnet are laterally pushed off from each other. On pushing off, a return force must be overcome, as the magnet and the armature are held in the starting position by the magnetic force. The smaller the friction between the mutually attracting surfaces, the larger the return force. This known effect can even be increased when magnet and armature have certain shapes and/or magnetizations. It is clear for example that with a suitable magnetization a triangular armature surface will be aligned with a likewise triangular magnetic surface of approximately equal size.

The technical teaching described above with reference to a shifting movement can analogously be applied by a skilled person to a rotary movement or to a tilting movement, without an inventive activity being required for this purpose.

In accordance with an embodiment, the magnet-armature structure includes a plurality of locking elements or a locking element with a plurality of locking portions. With this embodiment it is e.g. possible to better distribute the loading force applied.

In accordance with another embodiment, the magnet-armature structure includes a coupling device which has a clearance in the direction of movement of the movable magnet, so that the unlocking element will only be pulled in the direction of the magnet by means of a stop when the clearance is used up. The advantage of this embodiment consists in that the shifting path of the magnet from the armature can be larger than the path which the unlocking element must be shifted until the spring locking element is out of engagement with the blocking piece. With this embodiment, connecting structures can be built, in which due to constructive constraints the shifting path of the magnet from the armature must be larger than the path which the unlocking element is moved.

In accordance with another embodiment, the magnet-armature structure includes a coupling spring as coupling device, whose spring force extends along the direction of movement of the magnet and the unlocking element. The advantage of this embodiment consists in that with this combination of features a safety against opening of the connecting structure under load has been created. The coupling spring is dimensioned such that in the unloaded condition of the mechanical locking device the unlocking element is also pulled along on shifting the magnet via the coupling device. In the loaded condition, however, the friction force between the spring locking element and the blocking piece is greater than the spring force, i.e. the magnet can e.g. be shifted by hand, without the mechanical lock being opened. When the mechanical lock is relieved in this condition, the spring will immediately pull or urge the unlocking element in the opening direction, so that the connection can be opened.

In accordance with another embodiment, the magnet-armature structure includes a coupling device which has a clearance in the direction of movement of the movable magnet, so that the unlocking element will only be pulled in the direction of the magnet by means of a stop when the clearance is used up. Furthermore, a return spring is provided for the unlocking element, whose spring force extends along the direction of movement of the unlocking element. When the magnet is shifted from the armature and the clearance of the coupling device is used up, the return spring is tensioned. When the connection is released, the magnet and the armature pull each other into the opposed position and at the same time the unlocking element is urged into its starting position.

There also exists a multitude of combinations of this kind, in which stops, tabs and springs are employed, but which all follow the same technical teaching, so that depending on the technical constraints the skilled person can select a suitable combination without an inventive activity being required for this purpose. In particular, tension and compression springs can be combined.

In accordance with another embodiment, an actuating device operable by hand or with the foot is provided for moving the magnet or the armature, which is movably mounted in one of the two connecting modules.

In accordance with another embodiment, an object to be grasped by hand is provided on one of the connecting modules, which can be put onto the other connecting module by hand. This embodiment of the invention is suitable for connecting e.g. a bicycle lamp with the bicycle handlebar. In this case, the armature directly is integrally connected with the object.

In accordance with another embodiment, the magnet-armature structure includes at least one magnet in one connecting module and at least one ferromagnetic armature or a magnet poled for attraction in the other connecting module. This arrangement is preferred when an inexpensive connection is required.

In accordance with another embodiment, the magnet-armature structure includes a magnet with two ferromagnetic baffle plates in one connecting module and a ferromagnetic armature in the other connecting module, wherein the baffle plates are arranged such that they are in a magnetic relationship with the ferromagnetic armature and the magnet does not touch the armature. This arrangement is preferred when a robust connection is required, as with this magnet-armature structure there is no mechanical contact of the surface of the magnet with the surface of the armature, so that a damage of the sensitive magnet surface e.g. during repeated shifting is avoided, even if foreign particles such as sand are located interposed.

In accordance with another embodiment, the magnet-armature structure includes a magnet with a ferromagnetic baffle plate in one connecting module and a ferromagnetic armature in the other connecting module, wherein the magnet and the baffle plate are arranged such that they are in a magnetic relationship with the ferromagnetic armature. This arrangement is preferred when the magnetic force should be exploited particularly well, which is achieved by bundling the magnetic field lines in the baffle plate of the magnet.

In accordance with another embodiment, the magnet-armature structure includes a magnet with ferromagnetic baffle plates in each connecting module, wherein in the closed position the baffle plates face each other in a mutually attracting manner. This arrangement is preferred when a robust connection with a high force of attraction is required in the closed condition, and when an at least small repulsion is desired on opening.

In accordance with another embodiment, the magnet-armature structure includes at least two opposed magnets each, which in the closed condition of the connection both are in a position of attraction and in the open position are in a position of repulsion. This arrangement is preferred when a connection with a high force of attraction in the closed condition and with a high force of repulsion on opening is required.

In accordance with another embodiment, the magnet-armature structure includes a magnet arrangement, in which in each connecting module a magnet and a ferromagnetic armature are arranged such that in the closed condition the magnets are facing the armatures and are polarized such that in the open condition the magnets poled for repulsion are facing each other. This arrangement is preferred when an inexpensive connection with a high force of attraction in the closed condition and with a small force of repulsion on opening is required.

In accordance with another embodiment, the unlocking element includes a second sliding surface, in addition to the force-deflecting rising sliding surface which brings the spring locking element out of engagement with the blocking piece, which upon urging the spring locking element into the non-engagement position deflects the force of the tensioned spring locking element into an ejection force between the first connecting module and the second connecting module, in order to eject the first connecting module from the second connecting module. It is clear to the skilled person that the ejection force is obtained when either the spring locking pieces have been urged from a straight position into an inclined position and due to the slope produced the spring tension of the spring locking element has partly been converted into an ejection force, as far as the second sliding surface provides for low-friction sliding of the elements with respect to each other, or when the unlocking element pushes onto a slope on the spring locking element with the second sliding surface or an obliquely formed second sliding surface on the unlocking element interacts with the spring locking element or combinations of the aforementioned possibilities, which by means of bevels and sliding surfaces known to the skilled person at least partly convert the spring tension into an ejection force.

BRIEF DESCRIPTION OF THE DRAWINGS

The invention will be explained in detail below with reference to embodiments and associated drawings.

DETAILED DESCRIPTION OF THE INVENTION

Figures 1A, 1B, 1C:
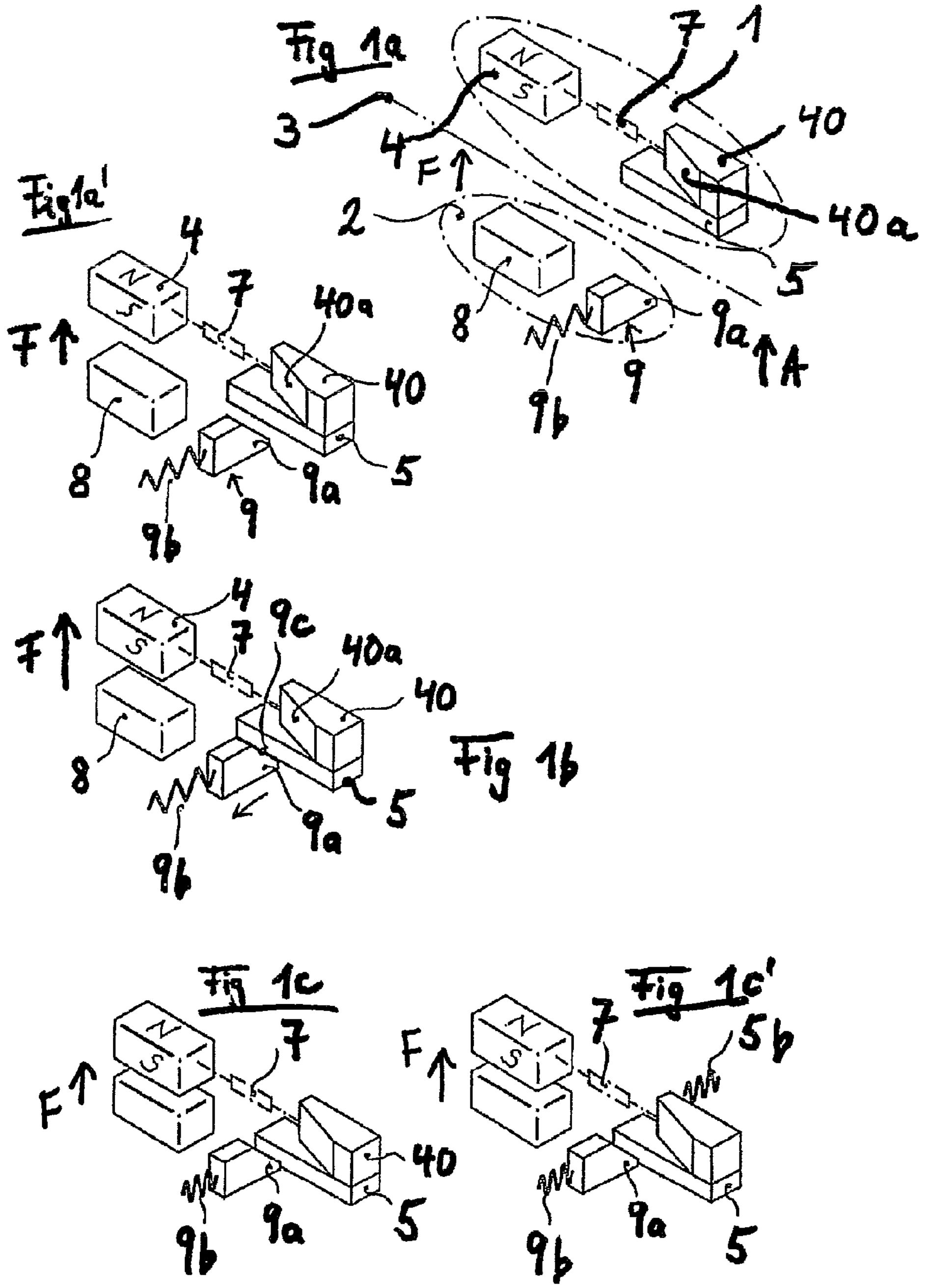
FIG. 1*a-e*, FIG. 1*z* show a schematic diagram.
Figure 1D:
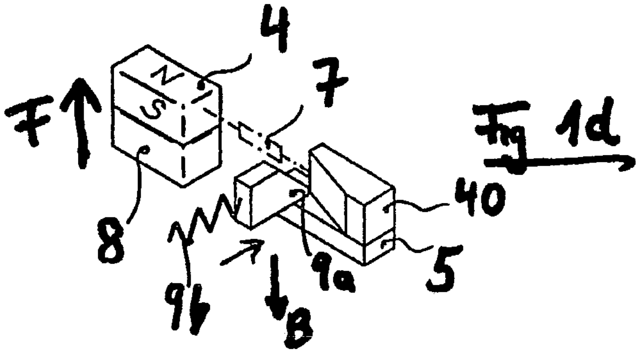

With the schematic diagram of FIGS. 1*a* to 1*e*, the general function of the invention is described. FIG. 1*f* shows a special function.

Reference numerals 1 and 2 designate the connecting modules to be connected, which for better clarity are separated by a separation line 3. Thus, both connecting modules face each other separately, i.e. with a spacing.

The connecting module 1 consists of a magnet 4, a blocking piece 5 and an unlocking element 40 with a force-deflecting portion 40*a*. The unlocking element 40 is connected with the magnet 4 via a coupling device 7.

The connecting module 2 consists of a ferromagnetic armature 8 and a spring locking element 9 which includes a locking piece 9*a* and a spring portion 9*b*. When the movable connecting module 2 approaches the stationary connecting module 1 from below, i.e. in direction of arrow A, a position according to FIG. 1*b* is reached.

In this position, the locking piece 9*a* rests against the blocking piece 5 with an engagement surface 9*c* which can be beveled. By means of the magnetic force F between the magnets 4 and 8 the resiliently held locking piece 9*a* is urged against the bottom edge of the blocking piece 5. The magnetic force F and the spring constant of the spring portion 9*b* are dimensioned such that the spring portion 9*b* bounces back in direction of arrow, so that a position according to FIG. 1*c* is reached.

In this intermediate position, the locking piece 9*a* has been urged back in direction of arrow. When it has reached the upper edge of the blocking piece 5, the spring portion 9*b* urges the locking piece 9*a* in the direction of arrow as shown in FIG. 1*d*.

In this position, the magnet surface and the armature surface are in contact or closely spaced, and the locking piece 9*a* now lies on the surface of the blocking piece 5, i.e. the lock has snapped shut. Thus, it is no longer possible to pull the connecting module 2 downwards, i.e. in loading direction B, as this is prevented by the lock.

It should be emphasized that the magnetic force has no substantial influence for the strength of the connection.

Figure 1E:
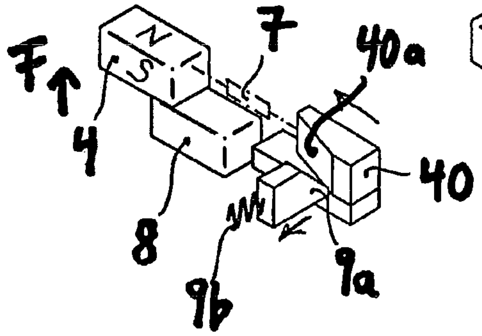
Figure 1E:
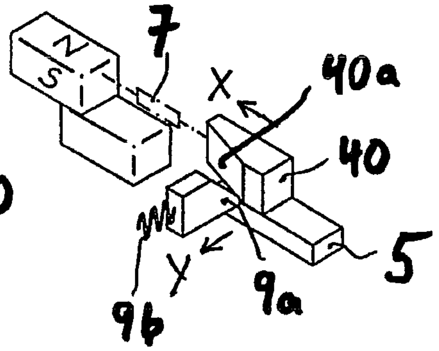

Releasing the connecting modules 1 and 2 from each other is shown in FIG. 1*e*. For this purpose, the magnet 4 is laterally pushed off from the armature 8 in the direction of arrow C. In this way, two functions are performed:

a. The spring locking element 9 is shifted via the coupling device, so that the locking piece 9*a* is urged back by the force-deflecting rising sliding surface 40*a* of the unlocking element 40, until the locking element 9*a* and the blocking piece 5 no longer are in engagement.
b. Due to the lateral displacement of the magnet 4, a considerable weakening of the magnetic force F occurs, so that the armature 8 is no longer or only weakly attracted by the magnet.

These two functions effect a haptically pleasant soft opening of the connection, as due to the at least strongly weakened magnetic force F the jerky separation otherwise so typical for magnetic closures does not occur.

It is clear to the skilled person that it is equivalent whether, as shown in FIG. 1*e'*, the blocking piece 5 is firmly arranged in the connecting module 1 and only the unlocking element 40 is moved, or whether the blocking piece and the unlocking element, as shown in FIG. 1*e*, are formed integrally and are moved together.

Figure 1Z:
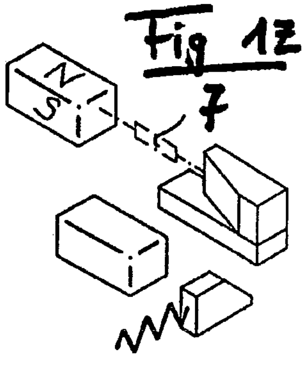
Figure 1Z:
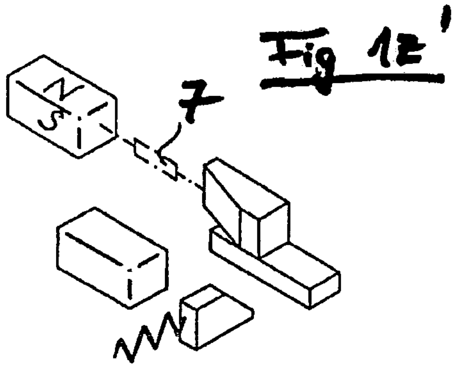
Figure 1F:
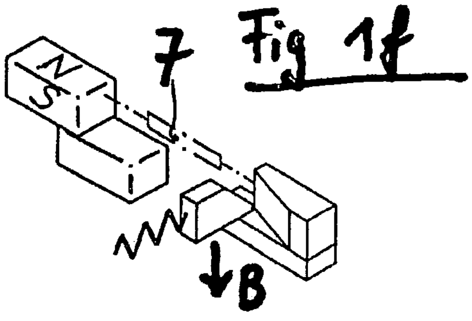
FIG. 1*f* shows a particular application.

FIG. 1*z* and FIG. 1*z'* show the separate connecting modules with movable or fixed blocking piece.

After separating the connecting modules, the magnet-armature arrangement is returned into the starting position according to FIG. 1*a* by suitable measures yet to be described, and here it should be noted that an automatic return is already effected by the magnetic force F. The skilled person knows that the degree of return depends on several factors, wherein the friction between magnet and armature is an essential factor.

Subsequently, the coupling device 7 will be explained. The coupling device 7 is a rigid or an elastic connection between the magnet 4 and the blocking piece 5. The coupling device 7 can, however, also be a partly fixed and loose connection, i.e. a connection with a clearance.

First, it is assumed that the coupling device 7 is a rigid connection. In this case, the magnet 4, the coupling device 7 and the blocking piece 5 must be regarded as an integral body. Accordingly, the force application point of the shifting force Fv is freely selectable. In FIG. 1*e*, the shifting force Fv acts on the magnet 4.

When the coupling device 7 is a tension spring, the force application point no longer is freely selectable, i.e. the force application point for the displacement force Fv must be chosen at the magnet 4, as shown in FIG. 1*f*.

In FIG. 1*f* an embodiment which will be explained in detail below in conjunction with FIG. 1*e*. The coupling device 7 is a tension spring. FIG. 1*e* shows that along with the displacement of the magnet 4 the displacement of the blocking piece 5 has also been effected. In FIG. 1*f*, the connected connecting modules 1 and 2 are under a tensile stress in loading direction B, i.e. the blocking piece 5 and the locking piece 9*a* of the spring locking element 9 are pressed against each other. Due to this contact pressure of the surface portions lying on top of each other it is prevented that the unlocking element 40 is pulled by the tension spring in the direction of the shifted magnet. Thus, a safety lock is obtained, which cannot be opened under load, as merely the magnet 4 can be shifted. The unlocking element 40 is blocked, as the friction force is greater than the spring force of the tension spring.

Figure 1G:
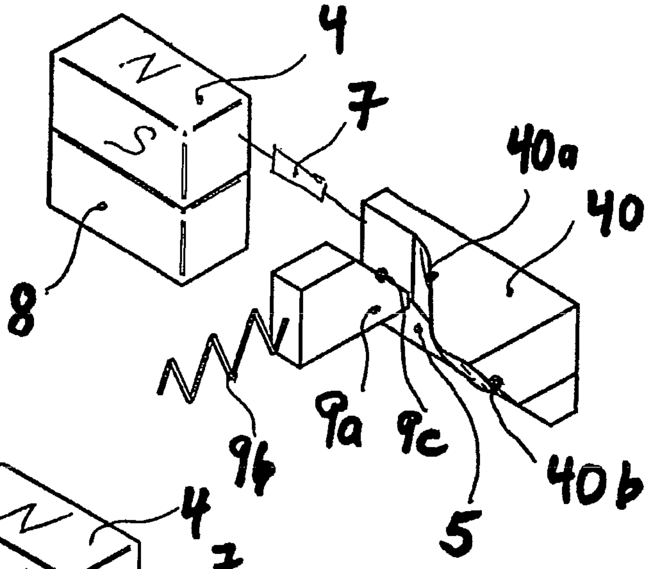
FIG. 1*g-i*, FIG. 1*g'-i'* show a particular application.
Figure 1H:
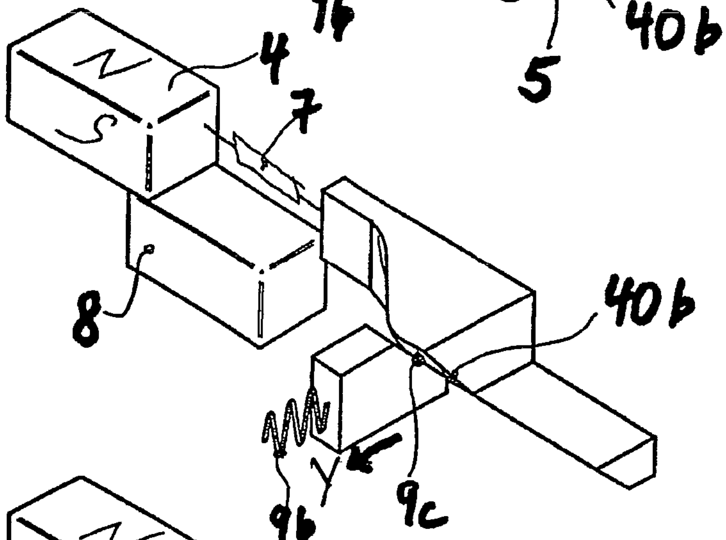
Figure 1I:
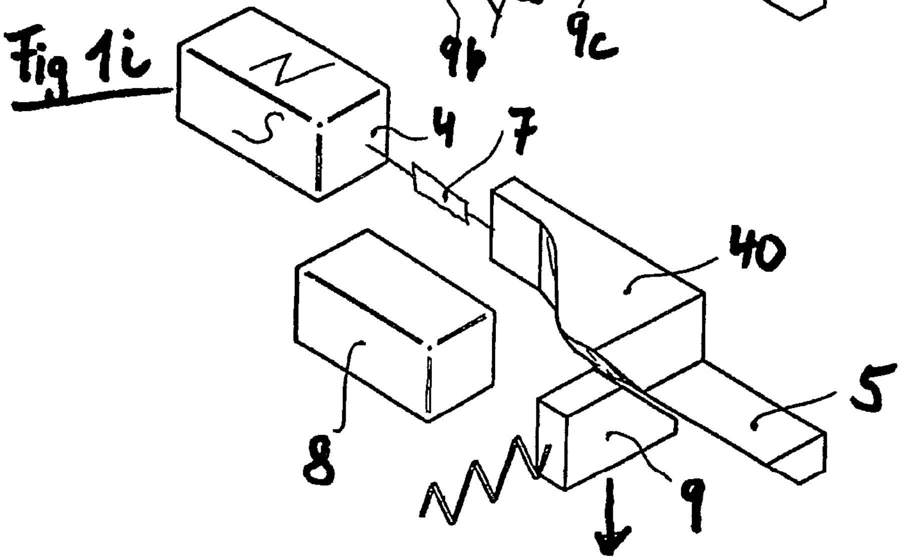
Figure 1G:
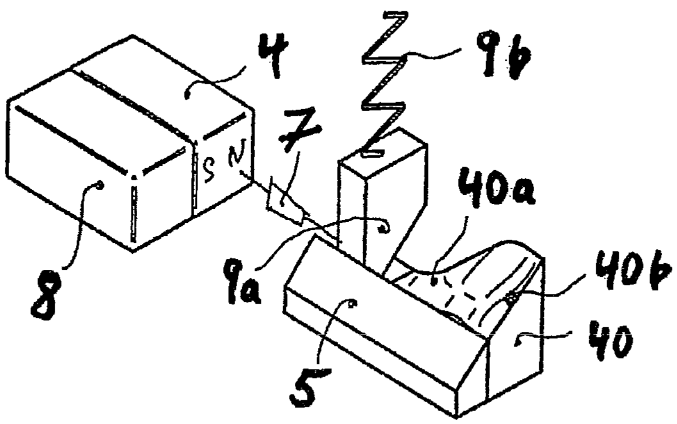
Figure 1H:
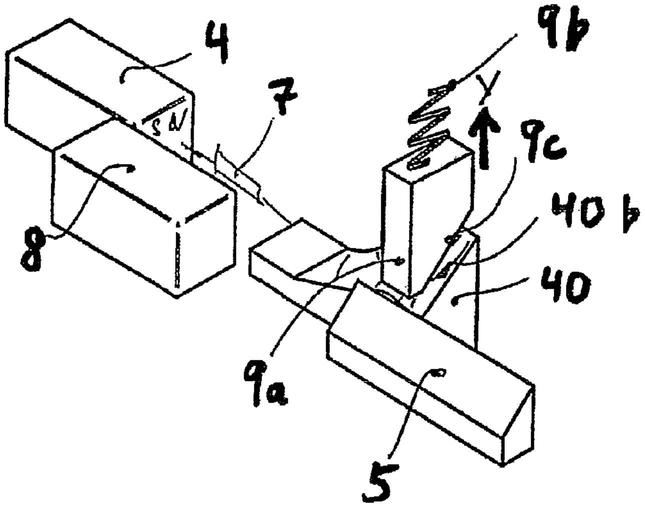
Figure 1I:
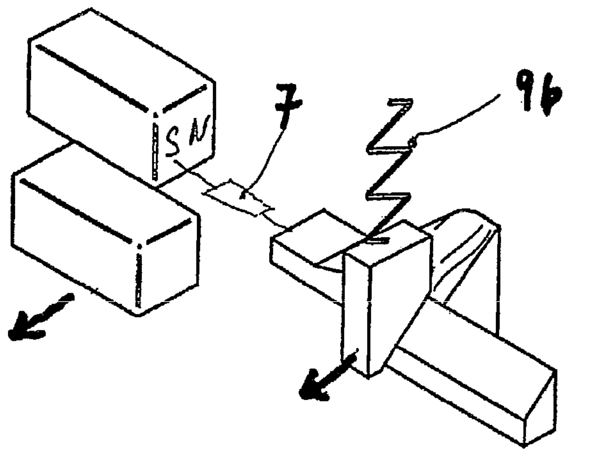

FIGS. 1*g*-1*i* show another embodiment. FIGS. 1*g*'-1*i*' show the same stages as FIGS. 1*g*-1*i* from a different perspective. FIG. 1 shows the closure in the closed condition corresponding to FIG. 1*d*. What is novel in FIG. 1*h* is the fact that the unlocking element 40 has a second sliding surface 40*b* which on opening is urged against the locking piece 9*a*. The second sliding surface 40*b* and the locking piece 9*a* have such a geometry that, as shown in FIG. 1*i*, the spring tension of the tensioned locking spring 9*b* is deflected into an ejection force in direction of arrow. This is particularly advantageous with closures having a magnet-armature system which in the open position still has a weakened residual attracting force. Due to adjustment of the spring force of the locking spring 9*b* to the residual attraction between magnet 4 and armature 8 in the open position, and by means of a suitable geometry of the force-deflecting portion 40*b* and the slope of the locking piece 9*c*, the ejection force in direction of arrow can be dimensioned such that this residual attracting force between magnet 4 and armature 8 is overcome and the closure opens automatically.

Finally, FIG. 1*c*' will be explained. It is clear to the skilled person that the function of the spring portion 9*b* can also be performed by the blocking piece 5, when the blocking piece 5 can resiliently yield in direction of arrow by means of a spring portion 5*a*. A combination likewise is possible, i.e. both a spring portion 9*b* and a spring portion 5*a* is provided. Thus, FIG. 1*c*' shows the same functional stages as FIG. 1.

The preceding observations concerning the coupling device related to the rigid and the elastic coupling device. When the coupling device is a connection with a clearance, the function cannot be explained with reference to FIG. 1. For this purpose, the following FIGURES are used.

Figure 2A:
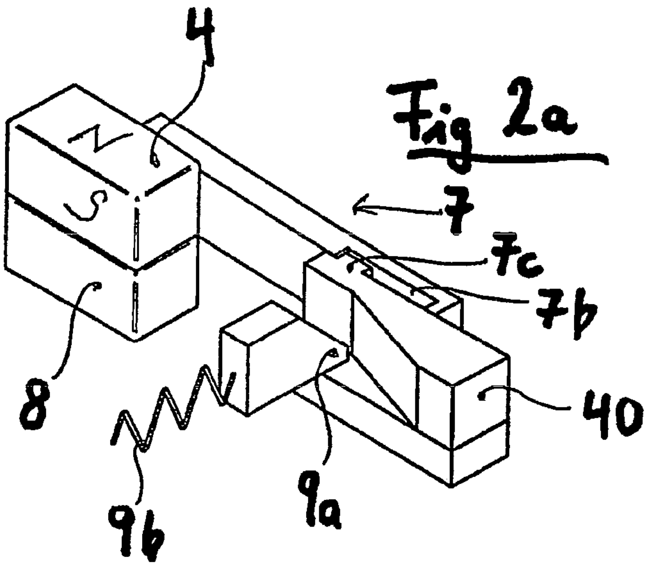
FIG. 2*a-b* show a schematic diagram of a first special coupling device.
Figure 2B:
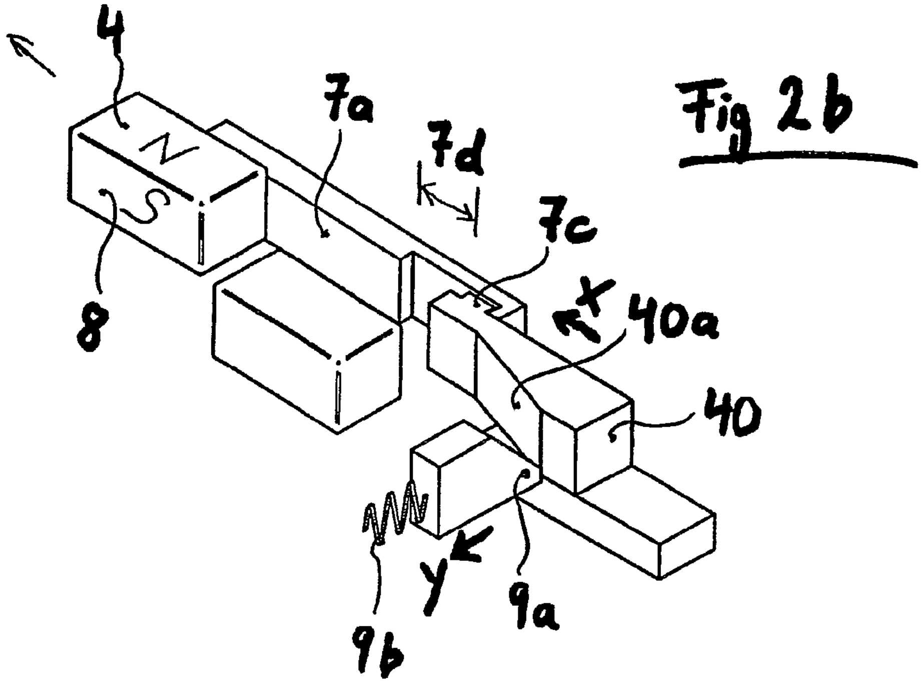

FIGS. 2*a*-*b* show a special coupling device 7. Since the general function of the invention has already been described in FIG. 1, not all function phases will be illustrated any more below. FIG. 2*a* shows a closed connecting structure, i.e. this function phase 2*a* corresponds to the function phase in FIG. 1*d*.

The magnet 4 is connected with the unlocking element 40 via a coupling device 7. On opening, the coupling device 7 has a clearance 7*d* along the direction of movement of the magnet. FIG. 2 shows that a coupling engagement piece 7*c*, which is firmly connected with the unlocking element 40, engages in a coupling recess 7*b*. The coupling recess 7*b* is longer than the coupling engagement piece 7*c*, so that a coupling clearance 7*d* is obtained. In FIG. 2*a*, the coupling engagement piece 7*c* rests against the left end of the coupling recess 7*b*. When the magnet 4 is shifted in direction of arrow, the coupling plate 7*a* with the coupling recess 7*b* likewise moves in this direction, until the coupling engagement piece 7*c* rests against the right end of the coupling recess 7*b*, i.e. the coupling clearance 7*d* has been traversed without the blocking piece 5 being moved.

When the magnet is shifted even further, the unlocking element 40 is also pulled along, so that, as known from FIG. 1*e*, the locking piece 9*a* is urged aside by the force-deflecting rising sliding surface 40*a* of the unlocking element 40, until the non-engagement position is reached. Thus, the connecting structure is opened, since both the positive lock is released and the attracting force between the magnet 4 and the armature 8 is weakened or strongly weakened. This results in a haptically pleasant opening behavior when the connecting structure is opened by hand. By means of suitable measures, a return into the starting position according to FIG. 2*a* is effected.

The advantage of these coupling devices with a clearance consists in that the magnet-armature structure can be constructed such that a particularly soft haptics is obtained with magnet-armature systems chosen to be particularly strongly attracting each other, in that the path of the displacement of the magnet 4 is particularly long, while at the same time the path of the displacement of the unlocking element 40 can be smaller and less friction occurs here. This can be used advantageously e.g. for a closure in which a plurality of narrow spring locking elements, which effect a uniform interlock, should be unlocked at the same time.

Figure 3A:
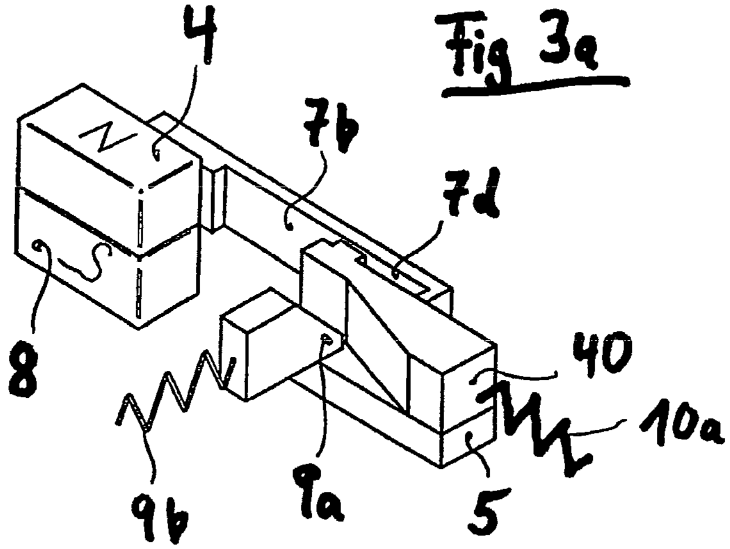
FIG. 3 *a-b* show a schematic diagram of a second special coupling device.
Figure 3B:
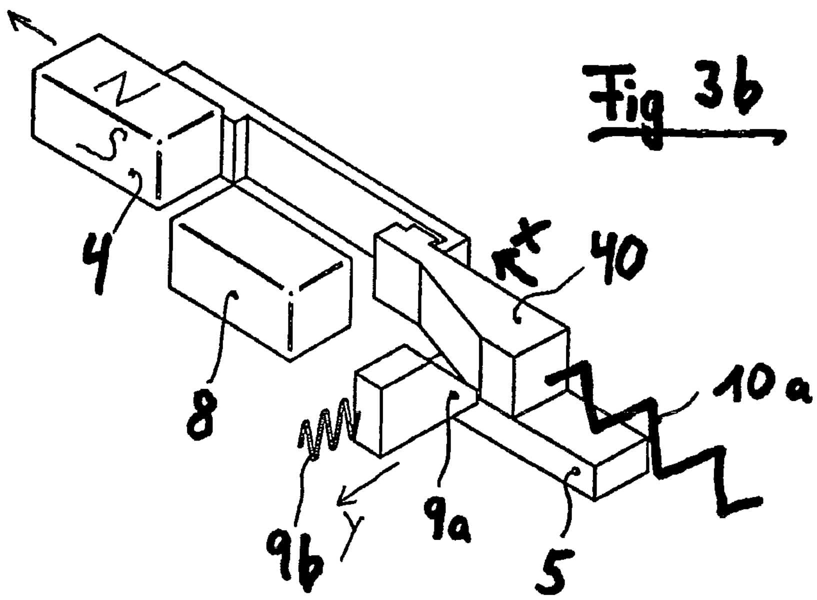

FIGS. 3*a*-*b* show another special coupling device 7. The general function has already been described with reference to FIG. 1, and the special effect of a coupling with clearance has been described with reference to FIG. 2. In FIG. 3, the coupling recess 7*b* is much longer. In addition, a return spring 10 is coupled to the unlocking element 40, which is expanded on displacement of the magnet 4 when the coupling clearance 7*d* is used up. After opening the connecting structure, i.e. after unlocking, the unlocking element return spring 10*a* again pulls back the unlocking element 40.

The advantage of these coupling devices with clearance is a very reliable return into the closed position, independent of the magnetic return. This coupling device is used for instance for safety belt closures.

Figure 4A:
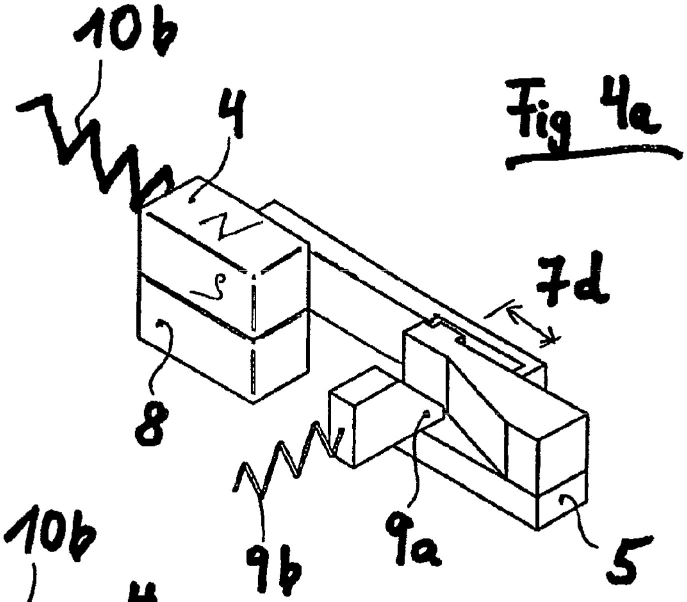
FIG. 4*a-b* show a schematic diagram of a third special coupling device.
Figure 4B:
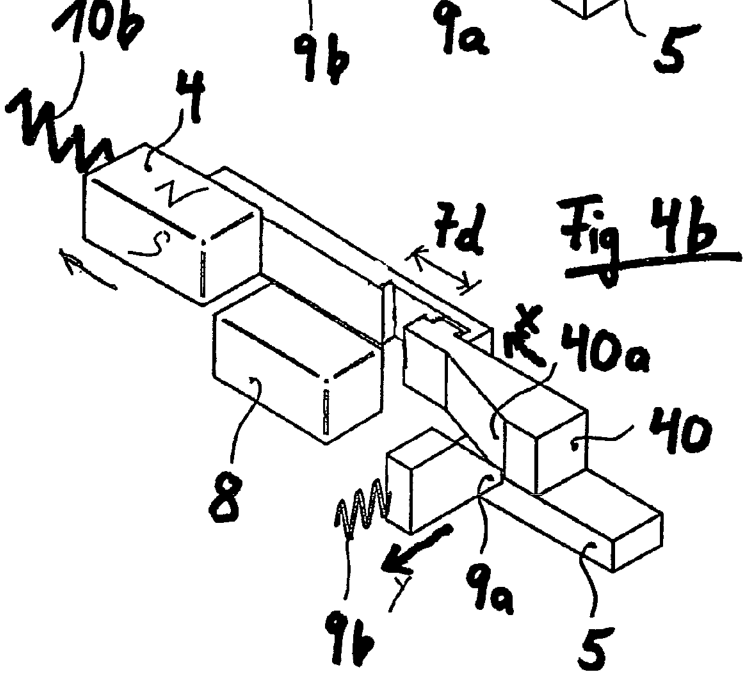

FIGS. 4*a*-*b* show a further special coupling device 7. The general function has already been described with reference to FIG. 1, and the special effect of a coupler with clearance has been described with reference to FIG. 2. To the magnet 4 a magnet return spring 10*b* is coupled in addition, which is compressed on shifting the magnet 4. After opening the connecting structure, i.e. after unlocking, the magnet return spring 10*b* again pushes back the magnet and hence also the unlocking element 40 via the coupling device 7, when the coupling clearance 7*d* is used up.

The advantage of these coupling devices with clearance consists in that when approaching the modules the magnets always are in the position of maximum attraction and thus are pulled towards each other particularly effectively. This coupling device is used for hardly accessible closures, which should optimally attract each other.

Figure 5A:
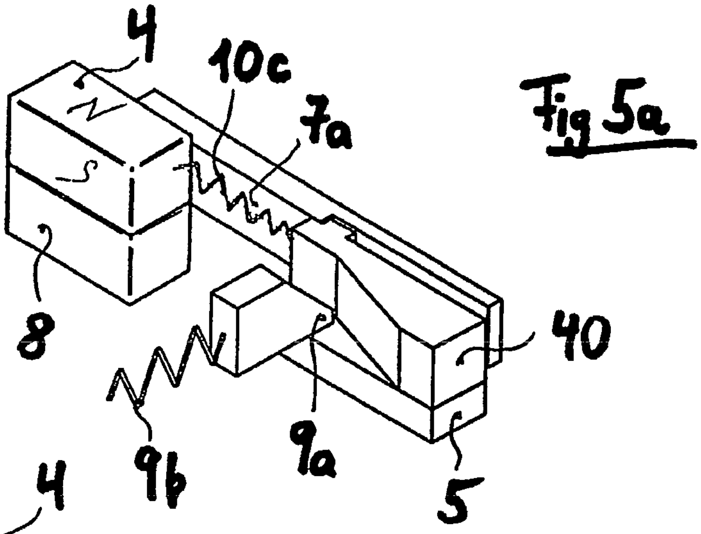
FIG. 5*a-c* show a schematic diagram of a fourth special coupling device.
Figure 5B:
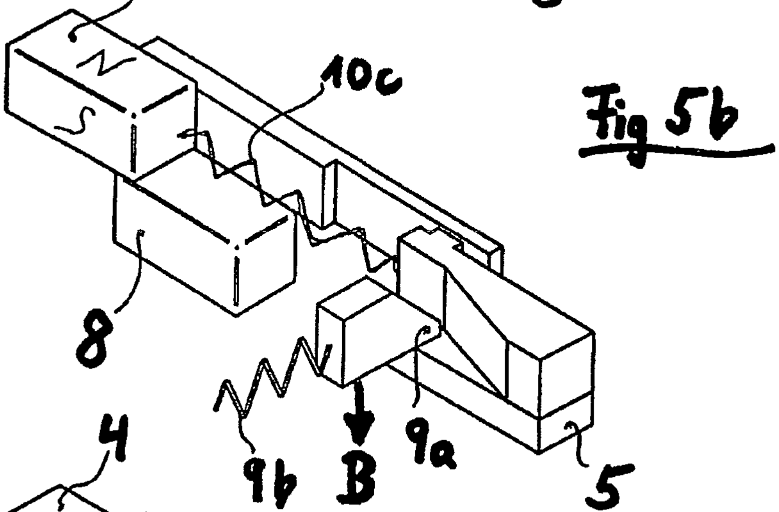
Figure 5C:
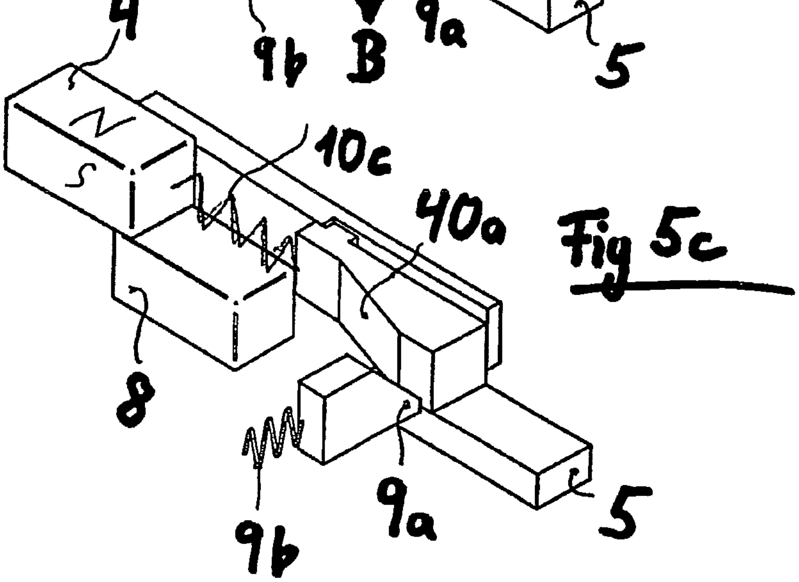

FIGS. 5*a-c* show a further special coupling device 7. The general function has already been described with reference to FIG. 1 and the special effect of a coupler with clearance has been described with reference to FIG. 2. This connecting structure relates to a safety function against opening under load, as described already in FIG. 1*f*. FIG. 5*a* shows the closed connecting structure under load, i.e. the locking piece 9*a* is pressed onto the blocking piece 5 in direction of arrow. Between the blocking piece 5 and the magnet 4 a magnet/unlocking element coupling spring 10*c* is arranged. When the magnet 4 according to FIG. 5*b* is shifted in direction of arrow, the magnet/unlocking element coupling spring 10*c* is expanded, while the unlocking element 40 is retained in its position by means of the locking piece 9*a*. When the loading force B has been removed, the magnet/unlocking element coupling spring 10*c* pulls the blocking piece 5 to the left, so that the locking piece 9*a* is urged into the non-engagement position by the unlocking element. Pushing back the unlocking element 40 to the right is effected by the left end portion of the coupling recess 7*b*.

The advantage of these coupling devices with clearance consists in that opening under load is prevented. These coupling devices are used for example for secured closures of loaded belts, ropes, cables etc., as they are required for mountaineer or yacht equipment.

Subsequently, the schematic diagrams of FIGS. 1 to 5 are described in special embodiments. As far as possible, it is indicated in the special embodiments on which one of the schematic diagrams of FIGS. 1 to 5 the respective special embodiment is based.

It is clear to the skilled person that the movements of the magnet and the unlocking element 40 and of the other elements are not limited to a linear movement. The linear movement, however, is best suited for explanation, so that for the description of the schematic diagram in FIGS. 1 to 5 the linear movement has been chosen. It is also clear to the skilled person that with respect to the arrangement of coupling devices and the configuration thereof a multitude of variants exist, already due to the combination of the illustrated variants, so that if necessary a skilled person can find suitable combinations or modifications without having to perform an inventive activity.

In the embodiments described below the movement of the magnet is linear.

FIG. 6 shows a closure for bags or satchels. FIG. 6*a* shows a perspective view of the essential components of the closure. The closures consists of the connecting modules 1 and 2, which are attached to the bag. In principle, the attachment can be effected in various ways, e.g. by sewing, sticking, riveting or screwing. In the following embodiments no further reference is made to the kind of possible attachments, since it is clear to the skilled person how such products are attached. The connecting module 1 constitutes a plug with a longitudinally extending wedge-shaped plug-in portion 11. The plug-in portion 11 includes a stationary blocking piece 5 and the unlocking element 40 formed integrally with the plug 11, which is provided with the force-deflecting rising sliding surfaces 40*a*1, 40*a*2, 40*a*3, 40*a*4. The spring locking element 9 is shown separately and is inserted into the spring locking element receiving opening 12 in direction of arrow. The magnets are shown in the following views.

Figure 6A:
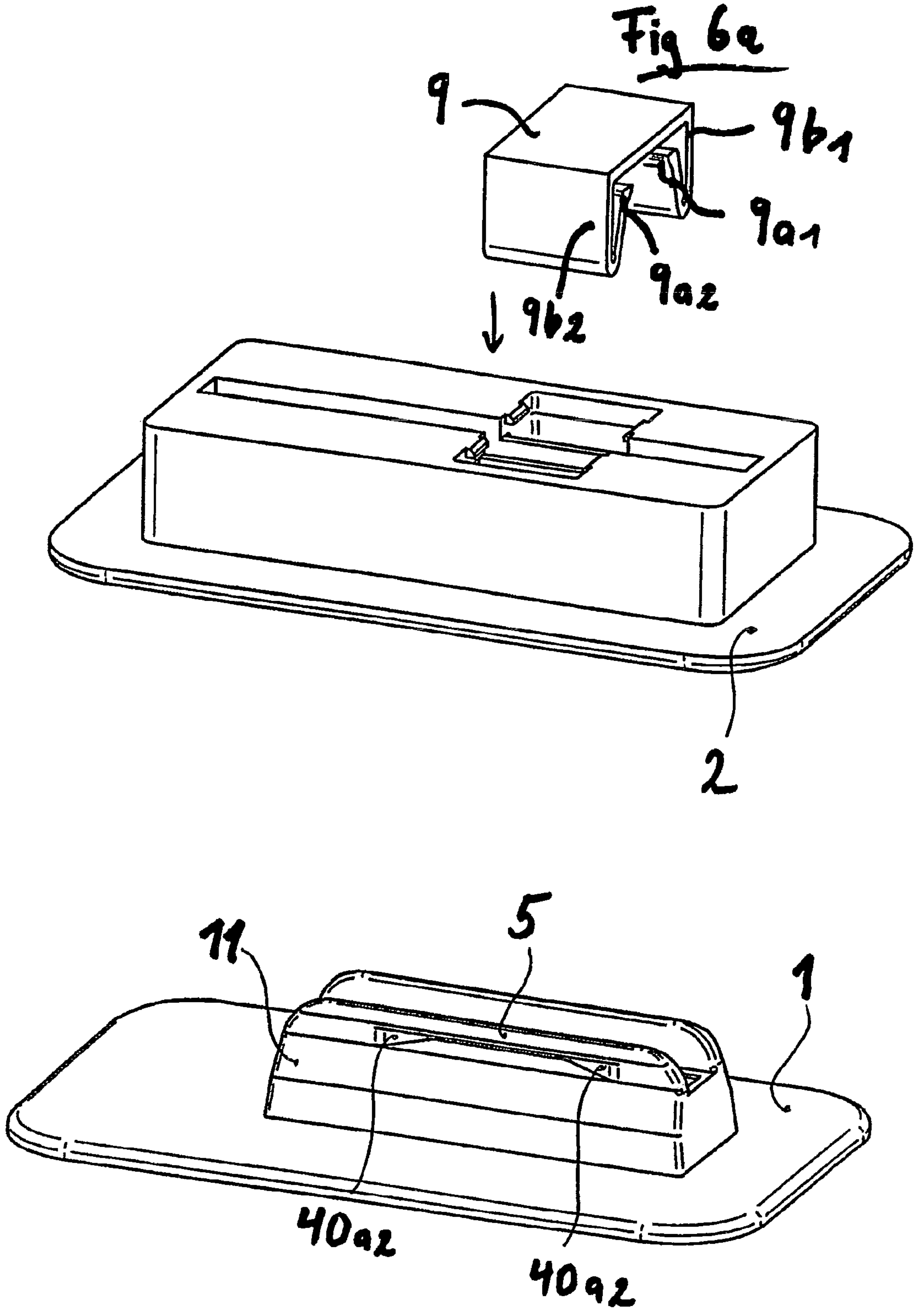
FIG. 6 shows a first special embodiment.
Figure 6B:
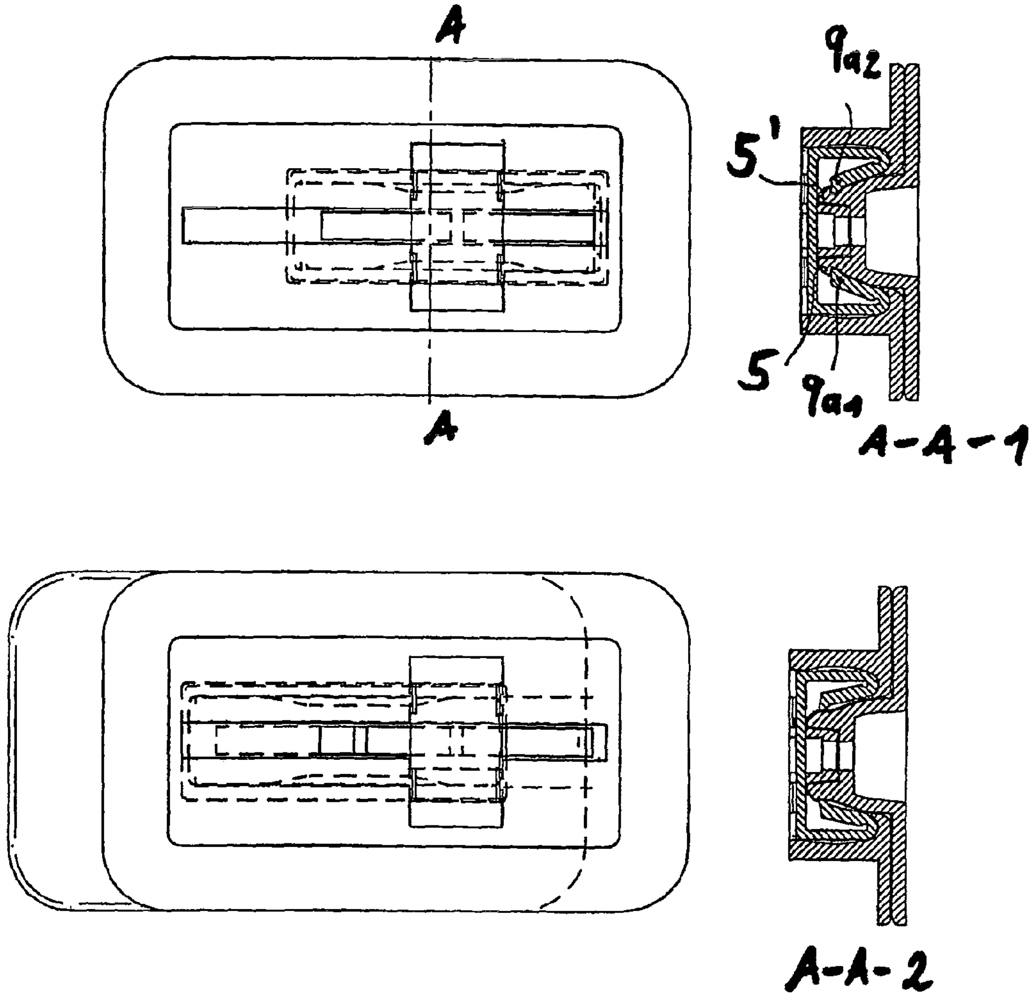
Figure 6C:
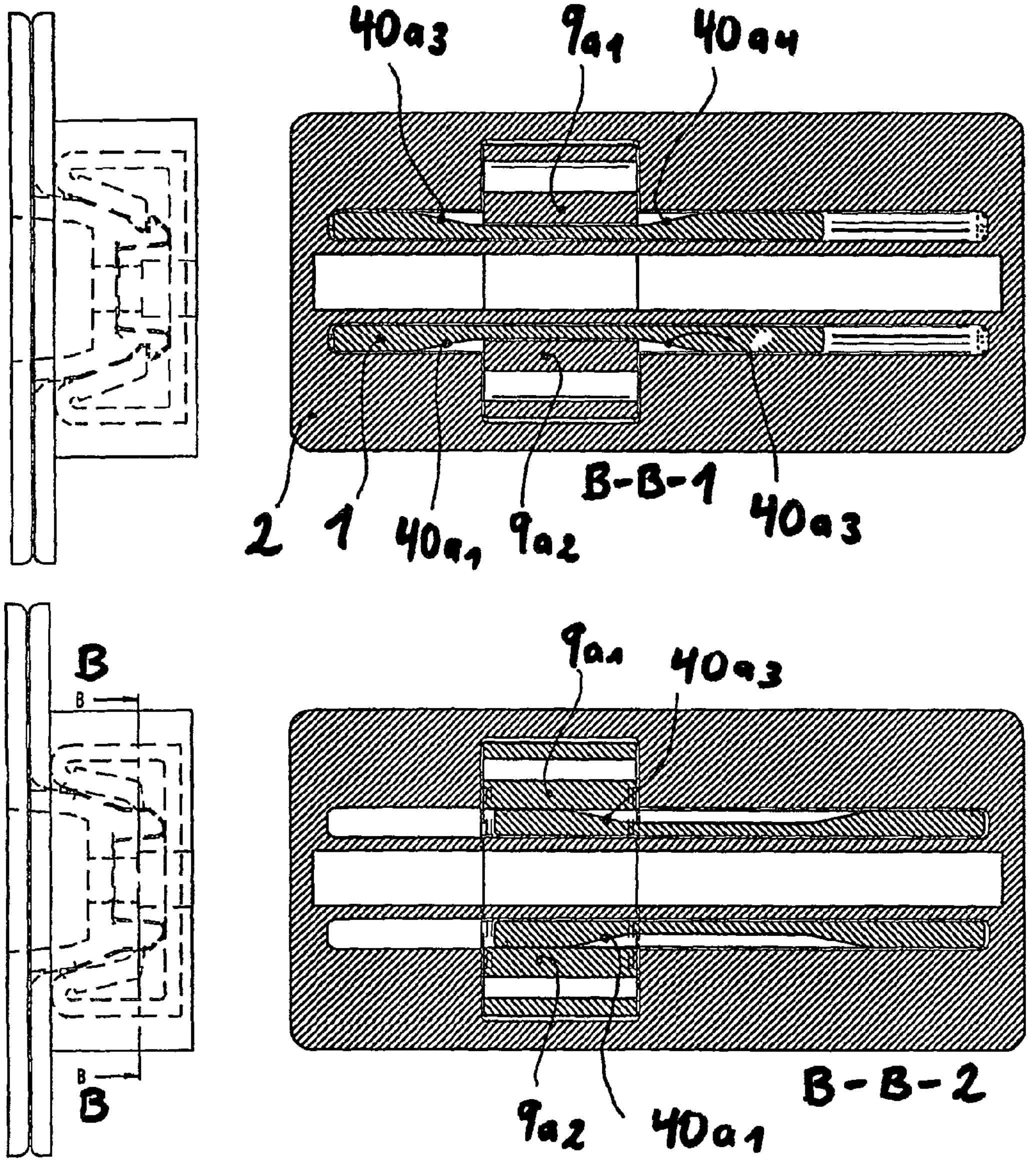

FIGS. 6*b* and 6*c* each show two sectional views A-A-1, A-A-2 and B-B-1, B-B-2, respectively, from which it can be taken how the two connecting modules are unlocked. In the sectional views A-A-1 and B-B-1, respectively, the spring locking elements 9*a*1 and 9*a*2 rest on the blocking pieces 5 and 5'. This corresponds to the function phase in FIG. 1*d*. In the sectional views A-A-2 and B-B-2, respectively, the spring locking elements 9*a*1 and 9*a*2 have already been bent back from the force-deflecting rising sliding surfaces 40*a*1 and 40*a*3. This corresponds to the function phase in FIG. 1*e*.

Figure 6D:
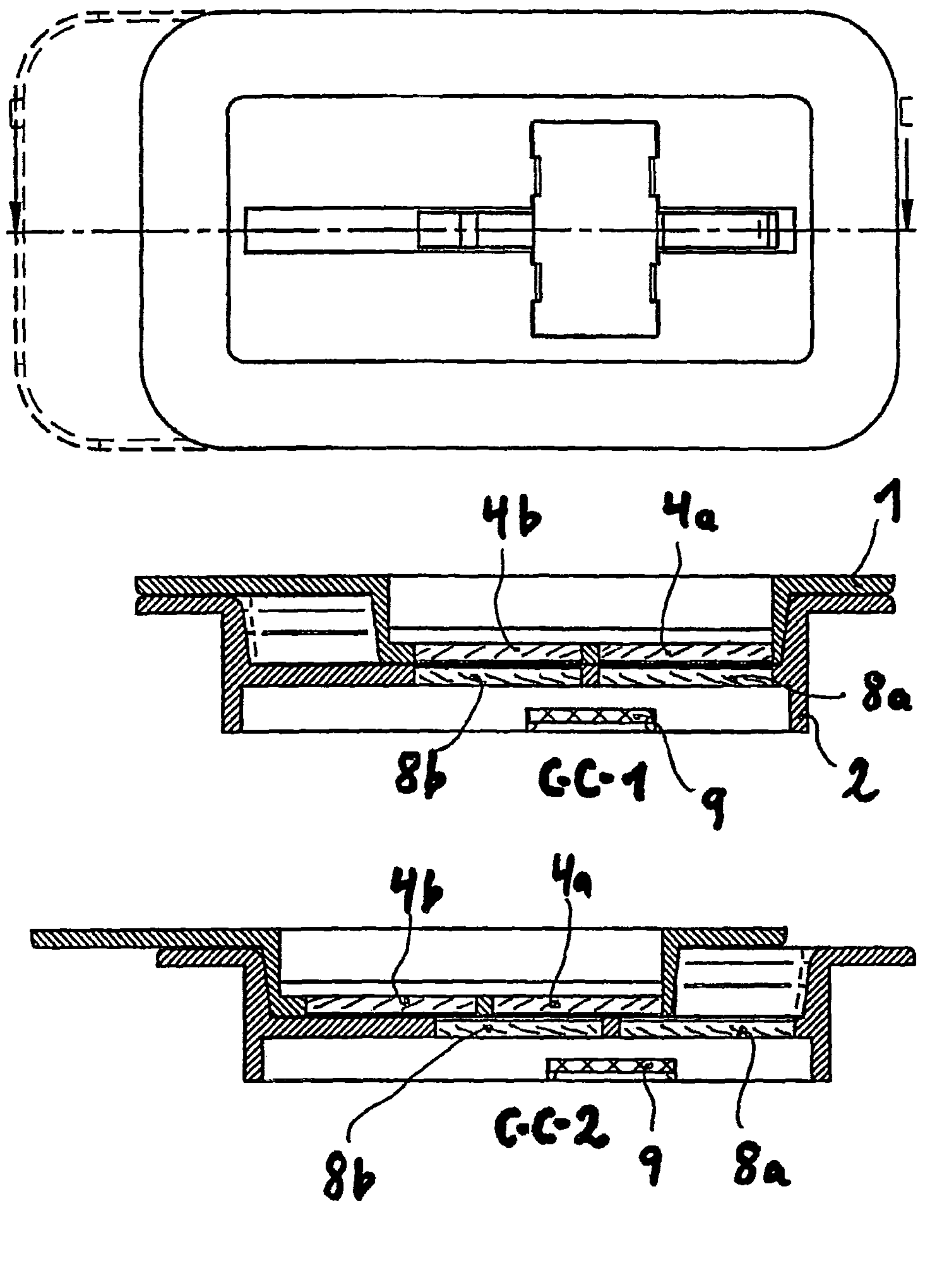

From the longitudinal sections C-C-1 and C-C-2 in FIG. 6*d*, the position of the magnets 4*a* and 4*b* and armatures 8*a* and 8*b* made of ferromagnetic material can be taken. It is clear to the skilled person that the armatures 8*a* and 8*b* likewise can be magnets. The position of the magnets 4*a* and 4*b* and of the armatures 8*a* and 8*b* must be determined by the skilled person such that in the illustrated sectional view C-C-1 the two connecting modules attract each other, i.e. either two mutually attracting magnets or a magnet and an armature must face each other. When e.g. armature magnets 8*a* and 8*b* likewise attractingly face the magnets 4*a* and 4*b*, the magnets 4*a* and 4*b* and the armature magnets 8*a* and 8*b* have unlike polarity. When the magnets 4*a* and 4*b* and the armature magnets 8*a* and 8*b* are shifted with respect to each other, two like magnetic poles face each other which effect a repulsion, which is described when separating the connecting modules.

FIG. 7 shows an embodiment of a snap buckle. FIG. 7*a* shows a perspective view of the snap buckle in the closed condition comparable to FIG. 1*d*. The connecting module 2 is configured as plug 2, which has a belt receptacle 64 and is inserted into the housing 1*a*. In the housing 1*a*, the tilting lever 1*b* is tiltably mounted in the axle bearings 63*a,b* via the axle stubs 62*a,b*. By means of the operating lever 50, the tilting lever can be tilted.

Figure 7A:
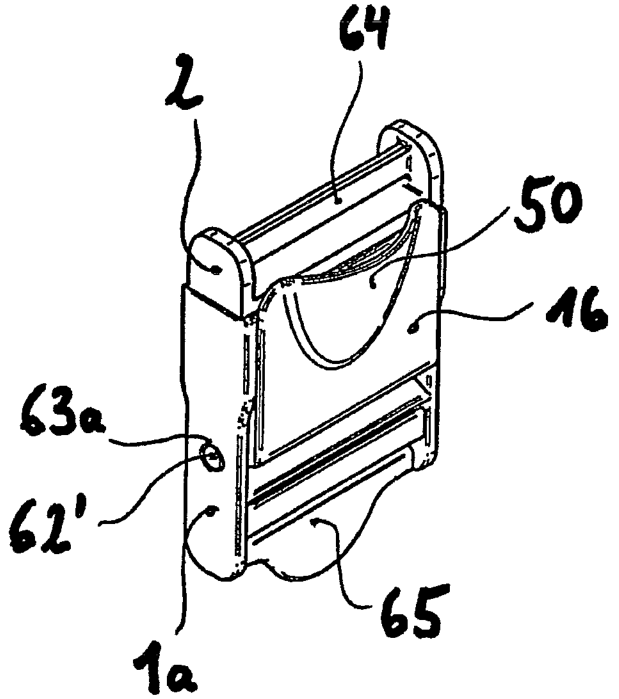
FIG. 7 shows a further special embodiment.
Figure 7B:
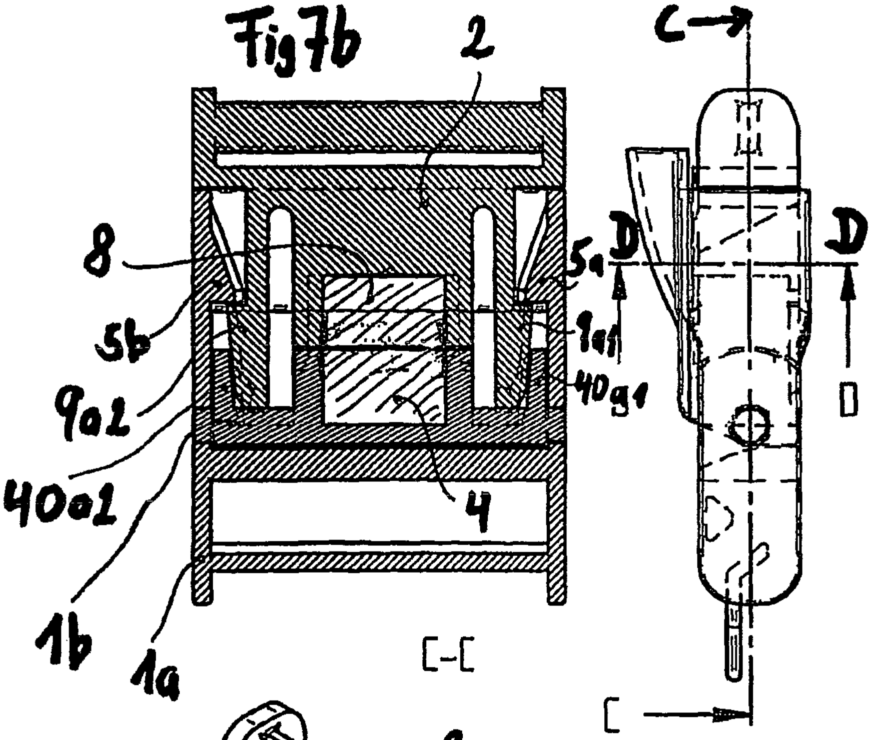
Figure 7C:
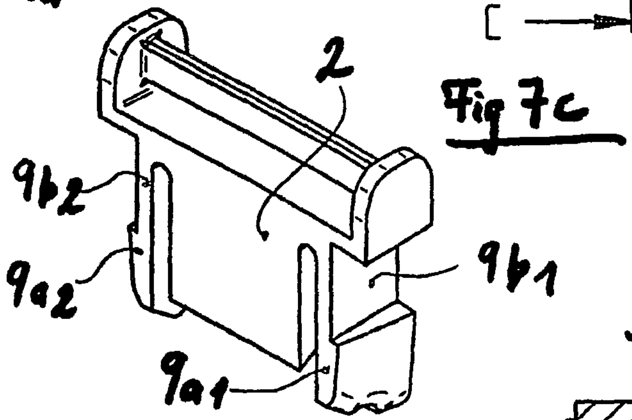
Figure 7D:
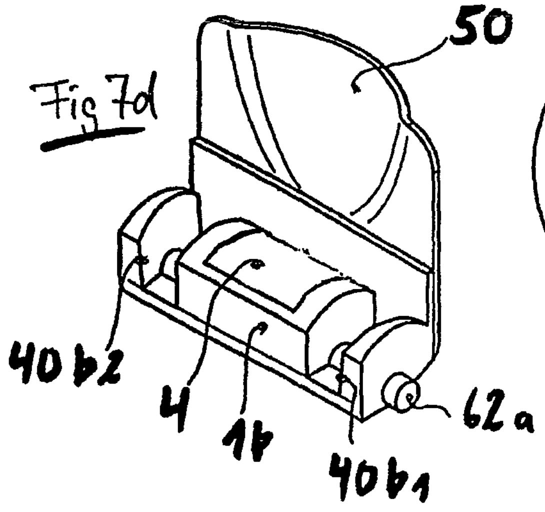
Figure 7E:
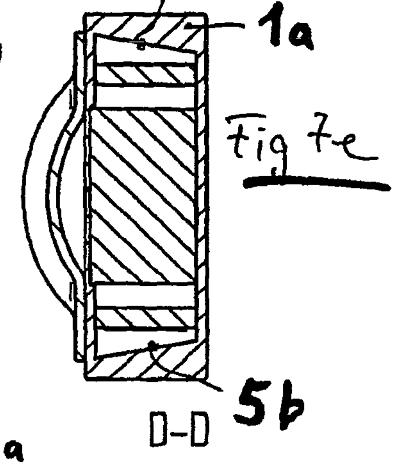

FIG. 7*b* shows the sectional view C-C of the closed snap buckle analogous to FIG. 1*d*. In the plug 2 the armature 8 is arranged, in the tilting lever 1*b* the magnet 4 is arranged. In the closed position, both face each other attractingly. A positive connection between the connecting modules 1 and 2 is obtained by engaging the locking pieces 9*a*1,2 with the blocking pieces 5*a,b*. The blocking pieces are firmly connected with the housing 1*a*.

Figure 7F:
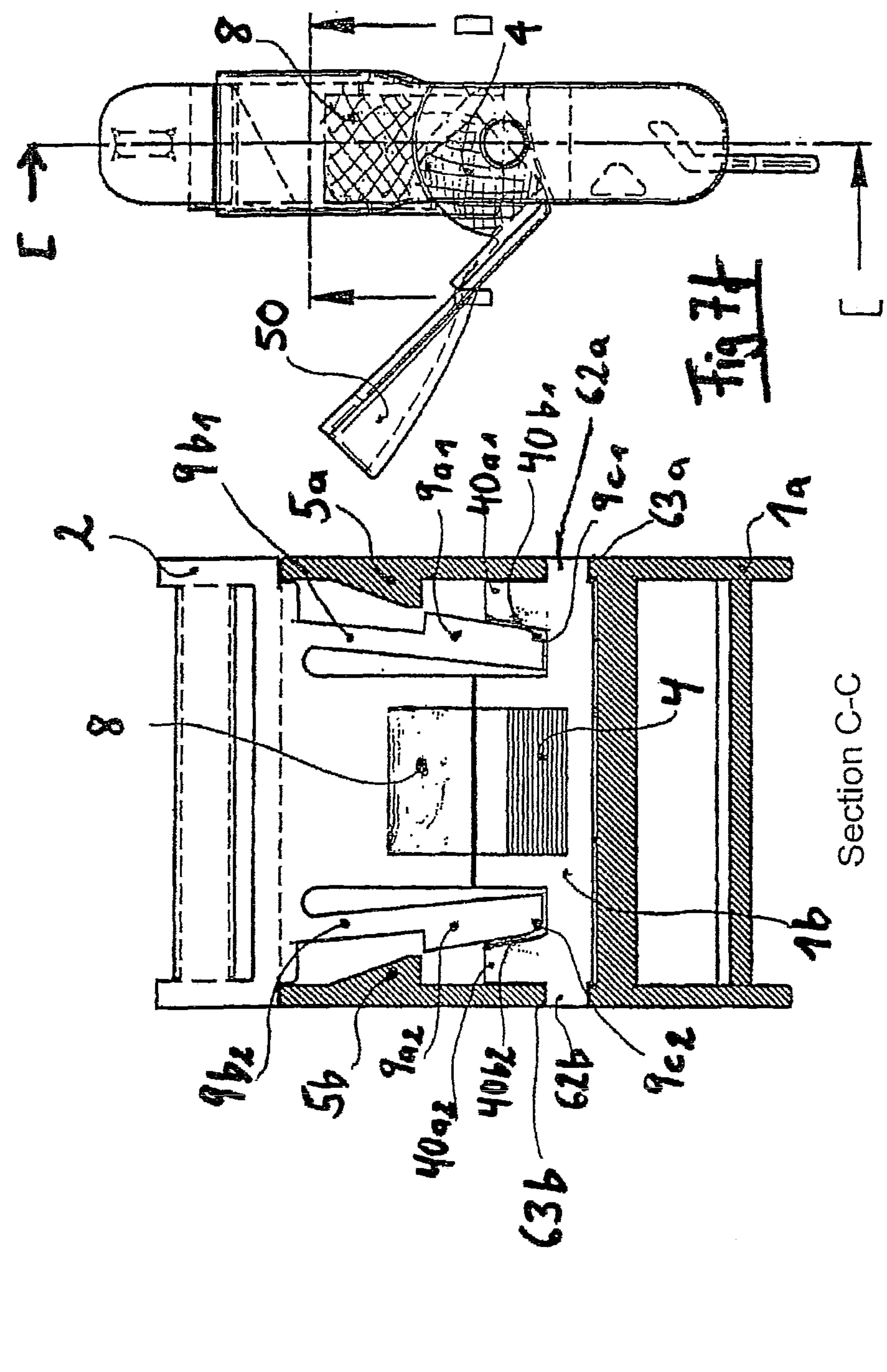

FIG. 7*f* shows the snap buckle in the phase analogous to FIG. 1*e*. Here, the force-deflecting rising sliding surfaces 40*a*1,2 of the unlocking elements have urged back the locking pieces 9*a*1,2 against the spring force of the locking springs 9*b*1,2 to such an extent that the locking pieces 9*a*1,2 are out of engagement with the blocking pieces 5*a,b* and the positive connection has been eliminated. In the right-hand view of FIG. 7*f* it can be seen that the magnet 4 and the armature 8 are tiltingly shifted against each other and the magnetic attraction is weakened correspondingly, so that the snap buckle is also magnetically released for opening.

In addition, the ejection assistance according to claim 15 is illustrated in FIG. 7*f* corresponding to FIG. 1*h*. In the shifted condition, the sliding surfaces 40*b*1,2 of the unlocking mechanism and/or the bevels 9*c*1,2 of the spring locking mechanism cooperate such that the spring tension of the springs 9*b*1,2 is deflected into an ejection force of the plug 2 out of the housing 1*a*.

FIG. 8 shows a closure for belt ends on rucksacks or bags or also for the holder of an ice pick. In this closure, the two connecting modules 1 and 2 no longer are shifted linearly with respect to each other, but are rotated concentrically with respect to each other.

Figure 8A:
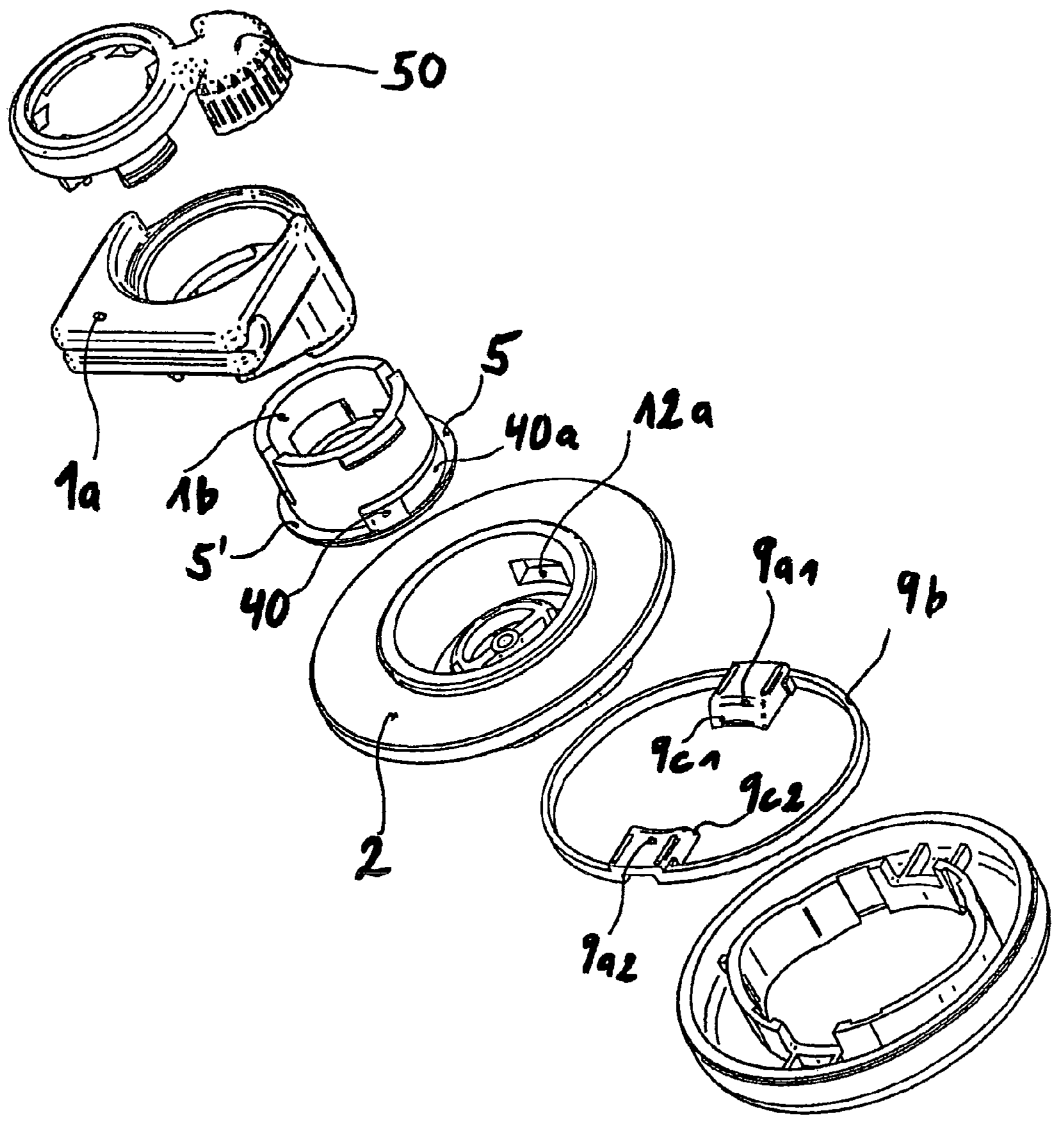
FIG. 8 shows a further special embodiment.

FIG. 8*a* shows the essential components except magnet and armature in an exploded view. The rotary part 1*b* for accommodating the magnets 4*a,b* (not shown) has a blocking piece 5 formed as circumferential edge, which is firmly connected with the rotary part, and likewise firmly connected unlocking elements 40 with the rising sliding surface 40*a*. The rotary part 1*b* is rotatably mounted in the first connecting module 1*a*. It is rotated by means of the operating lever 50, which on assembly is firmly connected with the rotary part 1*b*.

The spring locking element 9 is designed particularly softly resilient and thereby offers a particularly soft haptics with stable mechanical locking at the same time due to the transverse tension on the locking pieces 9*a*1,2. The spring locking element 9 is ring-shaped, wherein the ring forms the spring portion 9*b*. In the opposed position, two locking pieces 9*a*1 and 9*a*2 are connected with the ring, i.e. the spring locking element 9 is formed integrally. On the locking pieces 9*a*1 and 9*a*2 a bevel 9*c* each is provided, which is identical with the bevel 9*c* from FIG. 1. The locking pieces 9*a*1, 9*a*2 are movably mounted in the recesses 12*a,b* in the second connecting module 2.

Figure 8B:
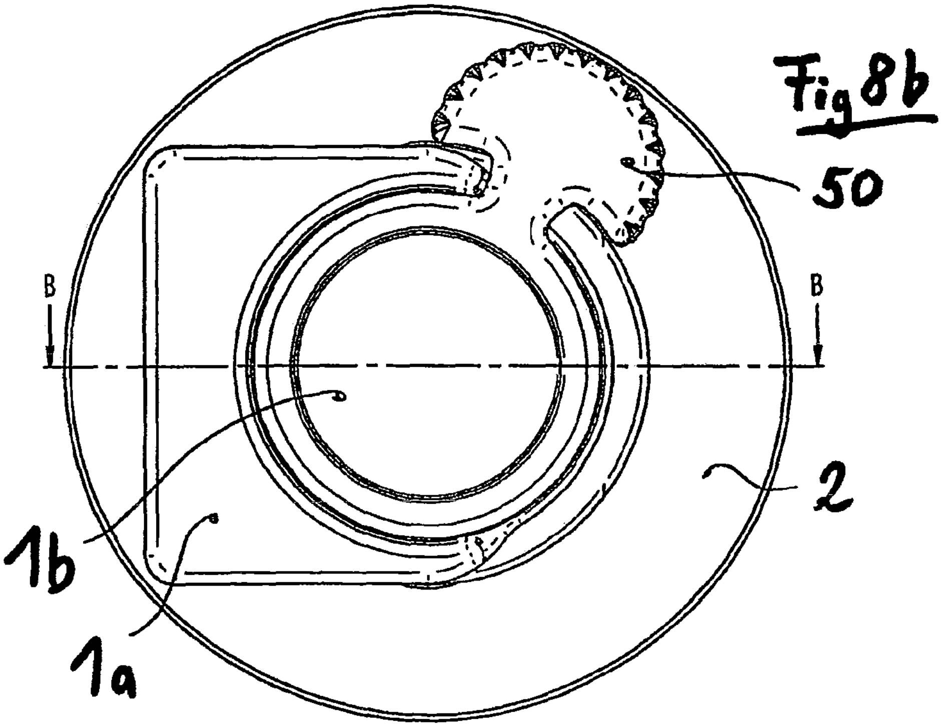

FIG. 8*b* shows the position of the sectional plane B-B. FIG. 8*d* shows the sectional representation B-B-1, in which the closed closure is shown. On closing, the locking pieces 9*a*1, 9*a*2 were urged aside by the blocking piece 5 and here are shown in engagement behind the blocking piece 5.

Figure 8C:
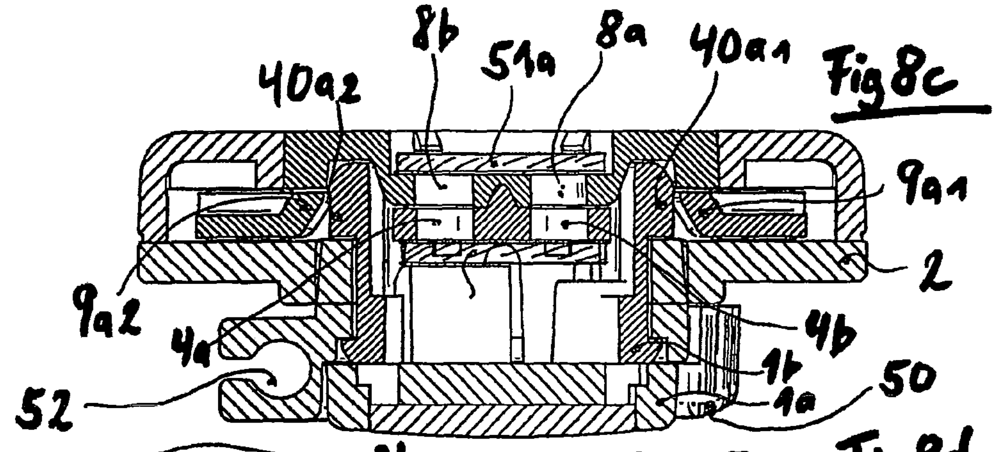
Figure 8D:
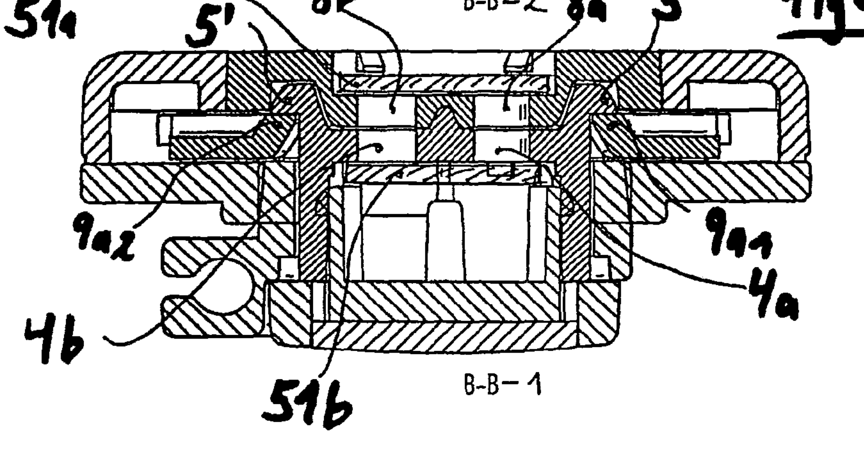

FIG. 8*c* shows the sectional representation B-B-2, in which the closure is illustrated in the actuated condition analogous to FIG. 1*e*. Here, the locking pieces 9*a*1, 9*a*2 were urged aside by the force-deflecting rising sliding surfaces 40*a*1, 40*a*2 of the unlocking element 40, such that the locking pieces 9*a*1, 9*a*2 and the blocking piece 5 are out of engagement.

In addition, FIGS. 8*c* and 8*d* show the arrangement of the magnet-armature system. The magnets 4*a*, 4*b* are rotatably mounted in the connecting module 1 a together with the rotary part 1*b*. The armature magnets 8*a* and 8*b* are firmly arranged in the connecting module 2. In the closed condition, the magnets 4*a*, 4*b* and the armature magnets 8*a*, 8*b* face each other such that in FIG. 8*d* unlike poles attractingly face each other or one armature and one magnet each attractingly face each other. In FIG. 8*c*, the magnets 4*a*, 4*b* have been shifted, and at least two unlike poles face each other, so that the closure is pushed open by the magnetic force.

Figure 8E:
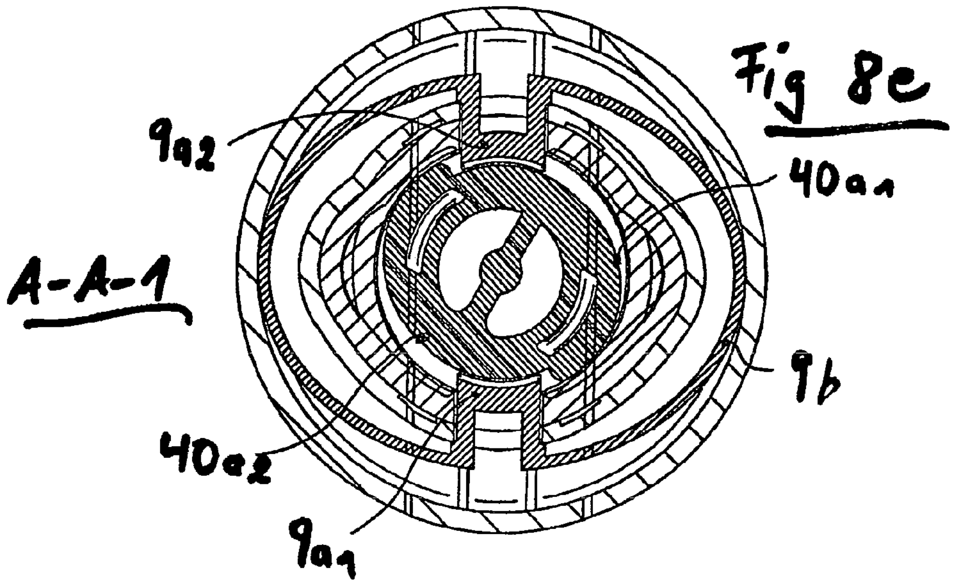
Figure 8E:
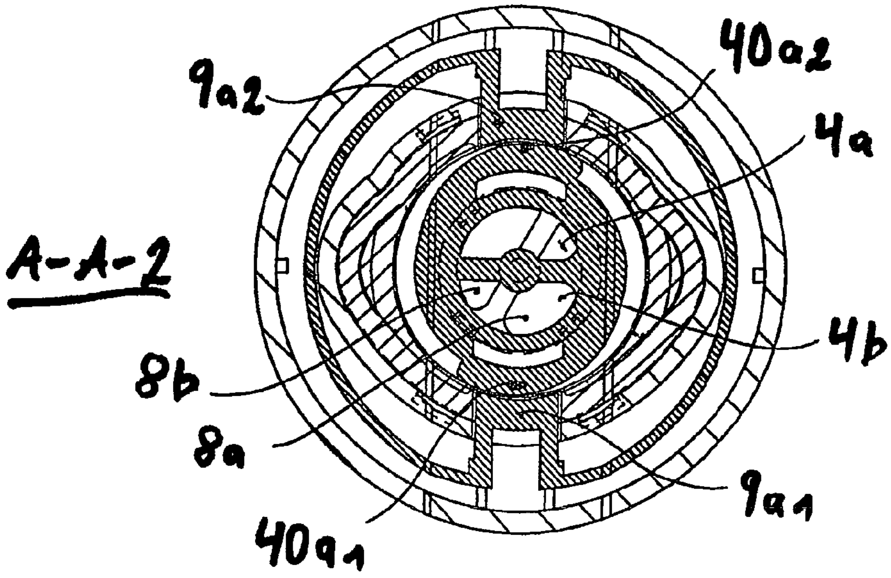
Figure 8E:
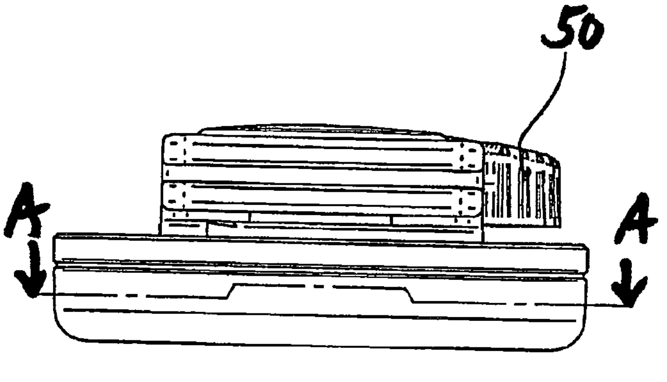

FIG. 8*e* again shows a sectional view A-A-1 of the closed position analogous to FIG. 1*d* and a sectional view A-A-2 of the shifted position according to FIG. 1*e*, in which the force-deflecting rising sliding surfaces 40*a*1, 40*a*2 have urged the locking pieces 9*a*1, 9*a*2 into the non-engagement position.

After these detailed explanations it has become apparent that further embodiments of the invention are possible in that in each form of movement, i.e. rotating, tilting or pushing, the connecting modules either are shifted against each other as a whole or are shifted against each other via an actuating device, i.e. magnet or armature are movably mounted in a connecting module. In addition, it is clear to the skilled person that various magnet systems can be used, which repel each other in the shifted condition. Finally, it is clear to the skilled person that there are most different arrangements for the blocking piece 5. The blocking piece 5 can be firmly connected with the magnet 4 movably mounted in the connecting module 1*a*, as shown in the embodiment according to FIG. 8. Alternatively, the blocking piece 5 can be firmly connected with the connecting module 1*a*, while the magnet is movably mounted in the connecting module 1*a*, as shown in the embodiment according to FIG. 7.

The application in the different embodiments, will once more be described below in a generalized form:

The closing and opening phases proceed in a cycle:

Closing:

Phase 1:

While approaching each other, i.e. in the range of action of the magnetic forces, the closure halves tend to laterally return to the opposed position with maximum attraction.

Phase 2:

Magnetic force in the closed position with maximum attraction overcomes snap closure.

Opening:

Phase 3:

Magnetic force is weakened by laterally shifting magnet 4 and armature.

Phase 4:

Along with this displacement, the snap closure gradually is urged out of engagement by the force-deflecting rising sliding surface 40*a*.

In the cycle described, the following forces act:

Phase 1: Magnetic force acts towards each other and laterally.

Phase 2: Magnetic force overcomes locking force along a short path.

Phase 3: Due to the shifting force, operator causes gradual overcoming of the magnetic force along a longer path, which leads to a pleasant haptics.

Phase 4: Due to the shifting force, operator causes gradual overcoming of the locking force along a longer path, which leads to a pleasant haptics.

The invention claimed is:

1. A mechanical-magnetic connecting structure for connecting two elements, to which one connecting module each can be attached, wherein the connecting modules comprise a locking device comprising:

at least one spring locking element, which is arranged in one of the connecting modules, and a blocking piece for positively locking the connecting modules, which is arranged in the other connecting module, and a movable unlocking element with a force-deflecting rising sliding surface, which likewise is arranged in the other connecting module, and a magnet-armature structure comprising at least one magnet which is arranged in one of the connecting modules and at least one armature which is arranged in the other connecting module, wherein the locking device is operatively connected in that:

a. the connecting module with magnet and the connecting module with armature can be shifted laterally with respect to each other and are formed such that a weakening of the magnetic force occurs the further the magnet and the armature are shifted against each other, b. the connecting module with magnet or the connecting module with armature is coupled with the unlocking element via a coupling device, so that in the case of the lateral displacement between magnet and armature the spring locking element is moved by the unlocking element from an engagement position in which the spring locking element is in engagement with the blocking piece into a non-engagement position in which the spring locking element no longer is in engagement with the blocking piece, wherein the force-deflecting rising sliding surface urges aside the spring locking element, c. the magnetic force is designed such that during a closing operation the connecting modules are pulled towards each other from a predetermined minimum distance, whereby the spring locking element is urged against the blocking piece, until the spring locking element snaps in engagement, and during a opening operation after reaching the non-engagement position between blocking piece and spring locking element the magnetic force is sufficiently weakened in order to separate the modules, and d. a return arrangement is provided for at least returning the unlocking element into the starting position in which the spring locking element can be brought in engagement with the blocking piece.

2. The mechanical-magnetic connecting structure according to claim 1, wherein a plurality of locking elements or a locking element with a plurality of locking portions are provided.

3. The mechanical-magnetic connecting structure according to claim 1, wherein the coupling device has a clearance in the direction of movement of the movable magnet, so that the unlocking element only is drawn in the direction of the magnet by means of a stop when the clearance is used up.

4. The mechanical-magnetic connecting structure according to claim 1, wherein the coupling device is a coupling spring whose spring force extends along a direction of movement of the magnet and of the unlocking element, wherein the spring force and the friction force between the blocking piece and the spring locking element are dimensioned such that when loading the connecting structure the friction force is greater than the spring force and the unlocking element remains in the closed position.

5. The mechanical-magnetic connecting structure according to claim 1, wherein the coupling device has a clearance in the direction of movement of the movable magnet, so that the unlocking element only is drawn in the direction of the magnet by means of a stop when the clearance is used up and that a return spring is provided, whose return spring force extends along the direction of movement of the magnet and of the unlocking element, so that after opening the connecting structure the unlocking element is urged back into its starting position.

6. The mechanical-magnetic connecting structure according to claim 1, wherein an actuating device movable by hand or with the foot is provided, which is connected with the magnet-armature structure such that the magnet is movable relative to the armature and the moved part is movably mounted in one of the two connecting modules.

7. The mechanical-magnetic connecting structure according to claim 1, wherein one of the connecting modules is an object which can be put onto the other connecting module and for removal is movable such that a relative movement is effected between magnet and armature.

8. The mechanical-magnetic connecting structure according to claim 1, wherein the magnet-armature structure in one connecting module includes at least one magnet and in the other connecting module at least a. one ferromagnetic armature or b. one magnet poled for attraction.

9. The mechanical-magnetic connecting structure according to claim 1, wherein the magnet-armature structure in one connecting module includes a magnet with two ferromagnetic baffle plates and in the other connecting module a ferromagnetic armature, wherein the baffle plates are arranged such that they are in a magnetic relationship with the ferromagnetic armature.

10. The mechanical-magnetic connecting structure according to claim 1, wherein the magnet-armature structure in one connecting module includes a magnet with a ferromagnetic baffle plate and in the other connecting module a ferromagnetic armature, wherein the magnet and the baffle plates are arranged such that they are in a magnetic relationship with the ferromagnetic armature.

11. The mechanical-magnetic connecting structure according to claim 1, wherein the magnet-armature structure in each connecting module includes a magnet with ferromagnetic baffle plates, wherein the baffle plates attractingly face each other and can be brought in mechanical contact.

12. The mechanical-magnetic connecting structure according to claim 1, wherein the magnet-armature structure includes a magnet arrangement with at least two opposed magnets each, which in the closed position of the connection are in a position of attraction and in the open position in a position of repulsion.

13. The mechanical-magnetic connecting structure according to claim 1, wherein the magnet-armature structure includes a magnet arrangement in which in each connecting module a magnet and a ferromagnetic armature are arranged such that in the closed condition the magnets are located opposite the armatures and in the open position the magnets poled for repulsion are facing each other.

14. The mechanical-magnetic connecting structure according to claim 1, wherein in addition to the force-deflecting rising sliding surface, which urges the spring locking element out of engagement with the blocking piece, the unlocking element includes a further sliding surface, which after shifting the spring locking element into the non-engagement position deflects the force of the tensioned spring locking element into a separating force between the connecting modules.

15. The mechanical-magnetic connecting structure according to claim 1, wherein the return arrangement comprises a magnetic force.

16. The mechanical-magnetic connecting structure according to claim 1, wherein the return arrangement comprises a spring.

* * * * *

UNITED STATES PATENT AND TRADEMARK OFFICE

CERTIFICATE OF CORRECTION

PATENT NO. : 8,484,809 B2
APPLICATION NO. : 12/669353
DATED : July 16, 2013
INVENTOR(S) : Joachim Fiedler It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 679 days.

Signed and Sealed this
Eighth Day of September, 2015

Michelle K. Lee
*Director of the United States Patent and Trademark Office*